US010581418B2

(12) United States Patent
Wu et al.

(10) Patent No.: US 10,581,418 B2
(45) Date of Patent: Mar. 3, 2020

(54) SYSTEM AND METHOD FOR FAST CONVERGING REFERENCE CLOCK DUTY CYCLE CORRECTION FOR DIGITAL TO TIME CONVERTER (DTC)-BASED ANALOG FRACTIONAL-N PHASE-LOCKED LOOP (PLL)

(71) Applicant: Samsung Electronics Co., Ltd., Gyeonggi-do (KR)

(72) Inventors: Wanghua Wu, Santa Clara, CA (US); Chih-Wei Yao, Sunnyvale (CA)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 16/019,070

(22) Filed: Jun. 26, 2018

(65) Prior Publication Data
US 2019/0214976 A1 Jul. 11, 2019

Related U.S. Application Data

(60) Provisional application No. 62/613,903, filed on Jan. 5, 2018.

(51) Int. Cl.
*H03K 5/156* (2006.01)
*H03L 7/099* (2006.01)
(Continued)

(52) U.S. Cl.
CPC ......... *H03K 5/1565* (2013.01); *H03L 7/0802* (2013.01); *H03L 7/091* (2013.01);
(Continued)

(58) Field of Classification Search
CPC ............ H03K 3/00; H03K 3/017; H03K 5/00; H03K 5/151; H03K 5/1565; H03K 7/00;
(Continued)

(56) References Cited

U.S. PATENT DOCUMENTS 7,683,683 B1 * 3/2010 Majumder ............. H03B 19/00
327/122
8,994,573 B2 3/2015 Henzler et al.
(Continued)

OTHER PUBLICATIONS

Temporiti, Enrico et al., A 3GHz Fractional All-Digital PLL With a 108 MHz Bandwidth Implementing Spur Reduction Techniques . . .

*Primary Examiner* — Lincoln D Donovan
*Assistant Examiner* — Dave Mattison
(74) *Attorney, Agent, or Firm* — The Farrell Law Firm, P.C.

(57) ABSTRACT

A system and method for fast converging reference clock duty cycle correction for a digital to time converter (DTC) based analog fractional-N phase-locked loop (PLL) are herein disclosed. According to one embodiment, an electronic circuit includes a clock doubler, a comparator that outputs a value representing a difference between a voltage at a voltage-to-current (Gm) circuit and a reference voltage that is adjusted to compensate for an offset of the comparator, and a duty cycle calibration circuit that receives the value output from the comparator and adjusts a duty cycle of the PLL by extracting an error from the value output from the comparator and delaying a clock edge of the duty cycle according to the extracted error.

20 Claims, 22 Drawing Sheets

(51) Int. Cl.
  *H03L 7/097*   (2006.01)
  *H04L 25/49*   (2006.01)
  *H03L 7/08*    (2006.01)
  *H03L 7/091*   (2006.01)

(52) U.S. Cl.
  CPC ............ *H03L 7/097* (2013.01); *H03L 7/0992* (2013.01); *H04L 25/4902* (2013.01)

(58) Field of Classification Search
  CPC ....... H03K 7/08; H03L 7/0802; H03L 7/0812; H03L 7/091; H03L 7/097; H03L 7/0992; H04L 25/00; H04L 25/4902
  USPC ........................................................ 327/175
  See application file for complete search history.

(56) References Cited

U.S. PATENT DOCUMENTS

| | | | |
|---|---|---|---|
| 9,041,576 B2 | 5/2015 | Klepser et al. | |
| 9,054,925 B1 | 6/2015 | Madoglio et al. | |
| 9,588,497 B1* | 3/2017 | Monk | G04F 10/005 |
| 9,654,093 B2 | 5/2017 | Yun et al. | |
| 2012/0280731 A1* | 11/2012 | Rhee | H03L 7/087 |
| | | | 327/157 |
| 2013/0063191 A1* | 3/2013 | Patil | H03K 5/1565 |
| | | | 327/156 |
| 2014/0035637 A1 | 2/2014 | Yao | |
| 2015/0036767 A1 | 2/2015 | Degani et al. | |
| 2015/0049840 A1 | 2/2015 | Banin et al. | |
| 2017/0366376 A1* | 12/2017 | Wang | H03L 7/093 |

\* cited by examiner

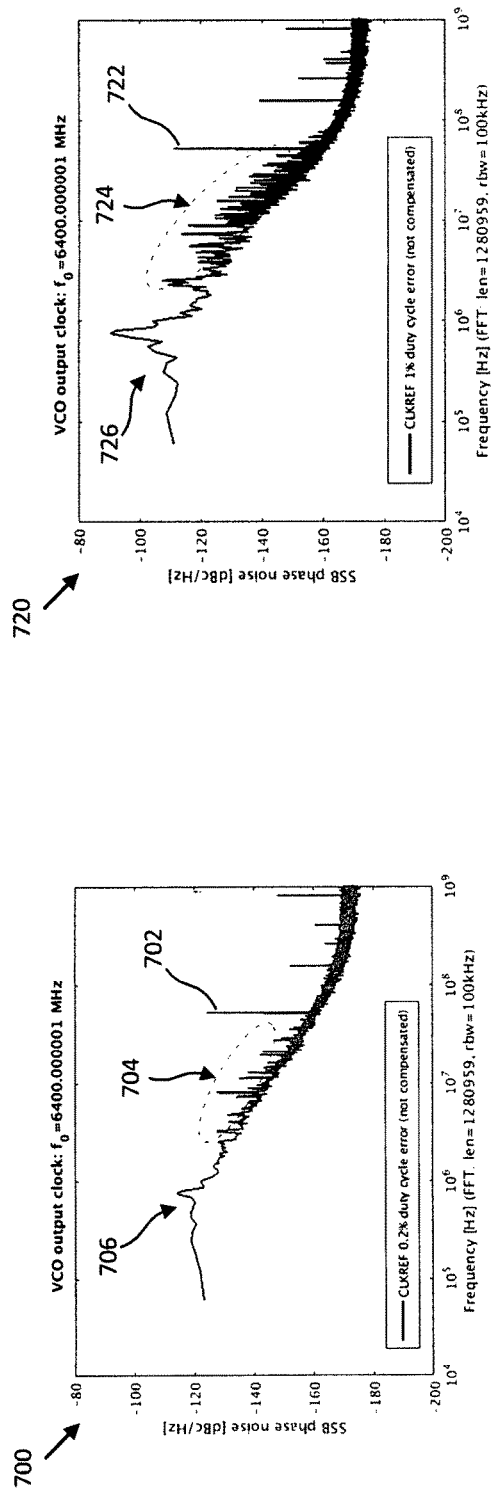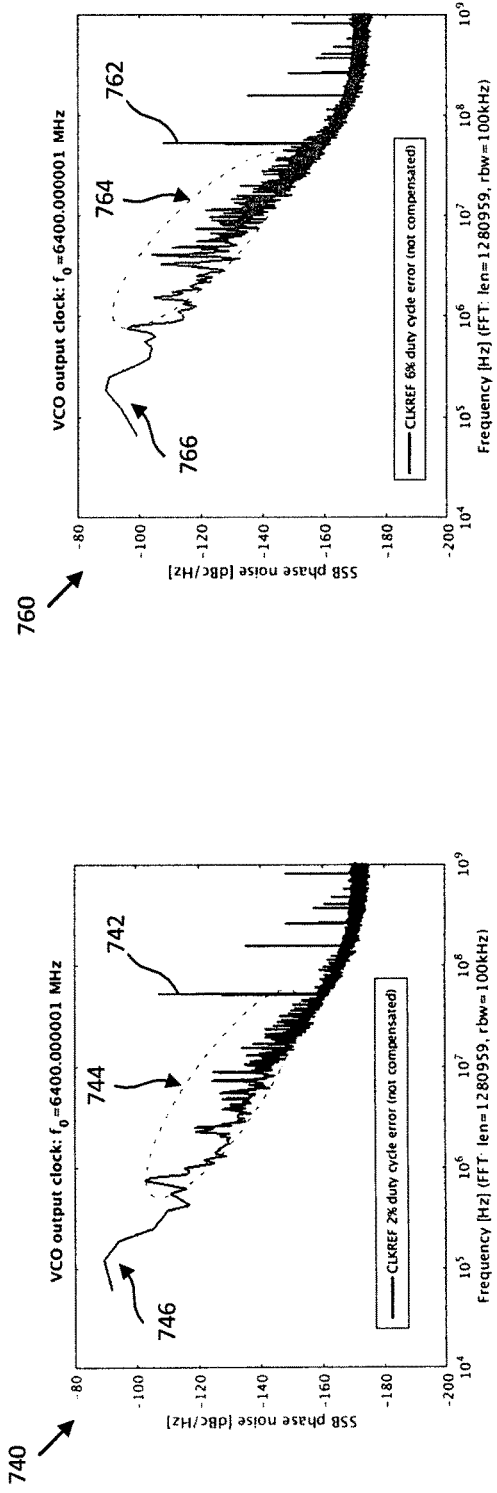
FIG. 7A  FIG. 7B  FIG. 7C  FIG. 7D

SYSTEM AND METHOD FOR FAST CONVERGING REFERENCE CLOCK DUTY CYCLE CORRECTION FOR DIGITAL TO TIME CONVERTER (DTC)-BASED ANALOG FRACTIONAL-N PHASE-LOCKED LOOP (PLL)

PRIORITY

This application claims priority under 35 U.S.C. § 119(e) to a U.S. Provisional Patent Application filed on Jan. 5, 2018 in the United States Patent and Trademark Office and assigned Ser. No. 62/613,903, the entire contents of which are incorporated herein by reference.

FIELD

The present disclosure relates generally to electronic circuits, and more particularly, to a system and method for fast converging reference clock duty cycle correction for digital-to-time converter-based analog fractional-N phase lock loops.

BACKGROUND

Digital-to-time converter (DTC) based fractional-N phase lock loops (PLLs) have demonstrated low power consumption, low phase noise, and good figures-of-merit compared to other fractional-N PLL architectures. DTC-based fractional-N PLLs can be realized in both digital PLL form and analog PLL form.

In-band phase noise of PLLs can be improved by doubling the reference clock rate. However, the reference clock does not typically have a 50% duty cycle, and doubling the reference clock may cause duty cycle errors which need to be corrected.

SUMMARY

According to one embodiment, a phase-lock loop (PLL) electronic circuit is provided. The electronic circuit may include a clock doubler, a comparator that outputs a value representing a difference between a voltage at a voltage-to-current (Gm) circuit and a reference voltage that is adjusted to compensate for an offset of the comparator, and a duty cycle calibration circuit that receives the value output from the comparator and adjusts a duty cycle of the PLL by extracting an error from the value output from the comparator and delaying a clock edge of the duty cycle according to the extracted error.

According to one embodiment, a method is provided. The method may include providing a clock doubler in a phase lock loop (PLL) circuit, outputting, by a comparator, a value representing a difference between a voltage at a voltage-to-current (Gm) circuit and a reference voltage, extracting, with the duty cycle calibration circuit, an error in a duty cycle of the PLL from the output value from the comparator, and adjusting, with the duty cycle calibration circuit, the duty cycle by delaying a clock edge of the duty cycle according to the extracted error.

According to one embodiment, an electronic device is provided. The electronic device having a phase-lock loop (PLL) electronic circuit may include a clock doubler, a comparator that outputs a value representing a difference between a voltage at a voltage-to-current (Gm) circuit and a reference voltage, a reference voltage generator that adjusts the reference voltage based on the value output from the comparator, and a duty cycle calibration circuit that extracts an error from the value output from the comparator and delays a clock edge of the duty cycle according to the extracted error.

BRIEF DESCRIPTION OF THE DRAWINGS

The above and other aspects, features, and advantages of certain embodiments of the present disclosure will be more apparent from the following detailed description, taken in conjunction with the accompanying drawings, in which:

FIGS. 7A, 7B, 7C, and 7D are graphs tracking PLL performance, according to an embodiment;

DETAILED DESCRIPTION OF EMBODIMENTS OF THE PRESENT DISCLOSURE

Figure 1:
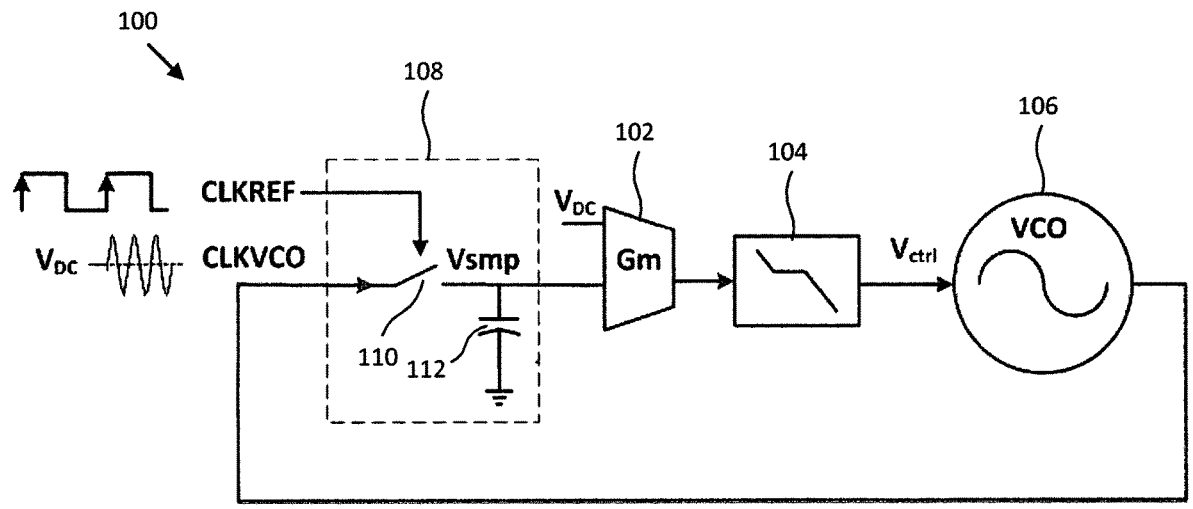
FIG. 1 is a diagram of an integer-N sub-sampling PLL, according to an embodiment.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

The electronic device according to one embodiment may be one of various types of electronic devices. The electronic devices may include, for example, a portable communication device (e.g., a smart phone), a computer, a portable multimedia device, a portable medical device, a camera, a wearable device, or a home appliance. According to one embodiment of the disclosure, an electronic device is not limited to those described above.

The terms used in the present disclosure are not intended to limit the present disclosure but are intended to include various changes, equivalents, or replacements for a corresponding embodiment. With regard to the descriptions of the accompanying drawings, similar reference numerals may be used to refer to similar or related elements. A singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, terms such as "$1^{st}$," "2nd," "first," and "second" may be used to distinguish a corresponding component from another component, but are not intended to limit the components in other aspects (e.g., importance or order). It is intended that if an element (e.g., a first element) is referred to, with or without the term "operatively" or "communicatively", as "coupled with," "coupled to," "connected with," or "connected to" another element (e.g., a second element), it indicates that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," and "circuitry." A module may be a single integral component, or a minimum unit or part thereof, adapted to perform one or more functions. For example, according to one embodiment, a module may be implemented in a form of an application-specific integrated circuit (ASIC).

Digital-to-time converter (DTC)-based fractional-N phase-locked loops (PLLs) have demonstrated low power consumption, low phase noise, and good figures-of-merit compared to alternative fractional-N PLL architectures. A DTC-based analog fractional-N PLL typically includes a sampler based phase detector, a voltage-to-current circuit (also referred to as a Gm circuit) to convert voltage to current, an analog loop filter, a multi-modulus divider, and a voltage controlled oscillator (VCO).

Figure 2:
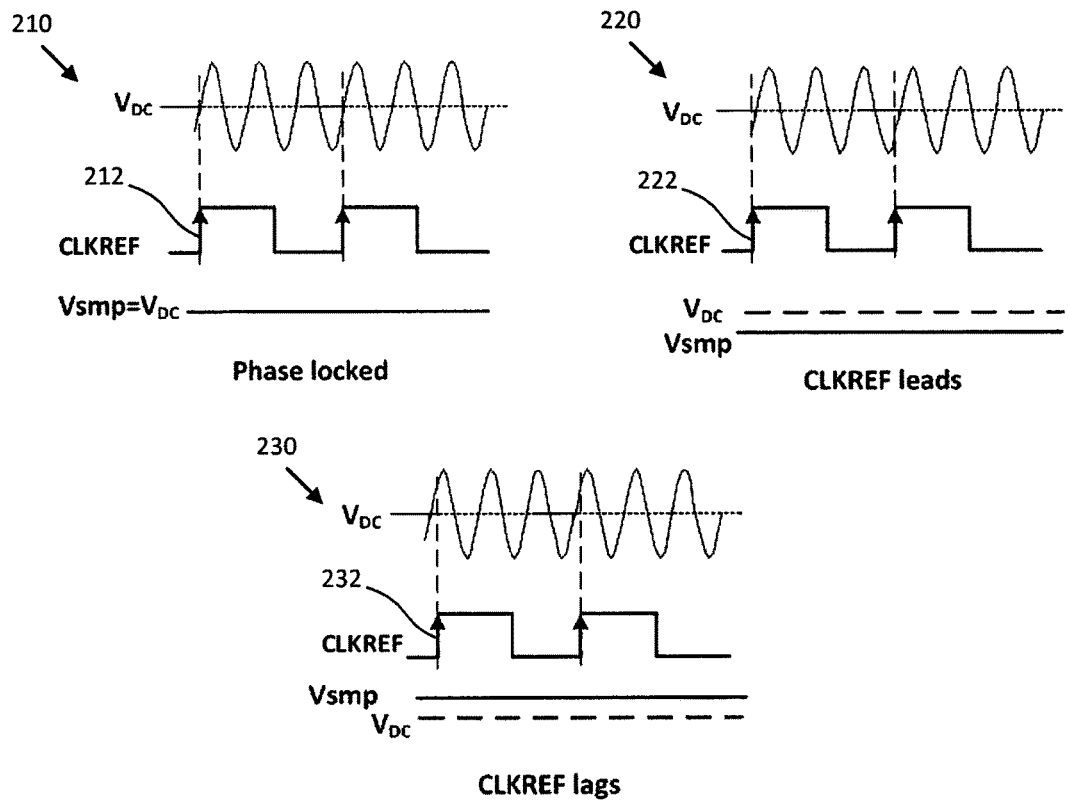
FIG. 2 are graphs for tracking the operation of the PLL, according to an embodiment.

FIG. 1 is a diagram of an integer-N sub-sampling PLL 100, according to an embodiment. FIG. 2 includes graphs 210, 220, and 230 for tracking the operation of the PLL 100, according to an embodiment. The PLL 100 includes a Gm circuit 102 that converts the input voltage to current, an analog loop filter 104 for filtering the signal received from the Gm circuit 102, a VCO 106 for producing a frequency and a sampling phase detector (SPD) 108. The rising edge of the CLKREF (e.g., rising edge 212 of graph 210, rising edge 222 of graph 220, rising edge 232 of graph 230) is used to sample the VCO output waveform (CLKVCO) and the sampled voltage is held in Vsmp for each CLKREF cycle. For an integer-N PLL (e.g., PLL 100), when CLKREF and CLKVCO are phase locked, the sampled voltage Vsmp is at the zero crossing of the VCO waveform ($V_{DC}$) as shown in graph 210, and the net current output of Gm 102 is zero. When CLKREF leads the VCO phase as shown in graph 220 or lags behind the VCO phase as shown in graph 230, the voltage Vsmp is non-zero and its value is proportional to the phase error between the two clocks CLKREF and CLK-VCO. Therefore, the sampling switch 110 and the sampling capacitor 112 together form the sampling phase detector 108, which converts the phase/timing error into a voltage error. The conversion gain of the SPD 108 is proportional to the slew rate of the VCO waveform. This linear approximation only works near the zero crossing of the VCO waveform. Thus, the SPD 108 has limited operating range and can only handle a small input phase/timing error (e.g., less than about 10 ps). In addition, the SPD 108 cannot detect frequency error. A sub-sampling PLL can lock to any harmonics of CLKREF, and thus, a frequency-locked loop (FLL) is required to make sure that the VCO frequency locks to the right harmonic or at least bring the VCO frequency close to the targeted frequency before the loop is switched to the SPD path. Alternatively, a divider with a fixed division ratio can be added in the feedback path to divide the CLKVCO down to the same rate as CLKREF and the loop becomes a sampling integer-N PLL instead of sub-sampling PLL.

The integer-N sampling PLL shown in FIG. 1 may be extended to a fractional-N frequency synthesizer by implementation of a digital-to-time converter (DTC).

Figure 3:
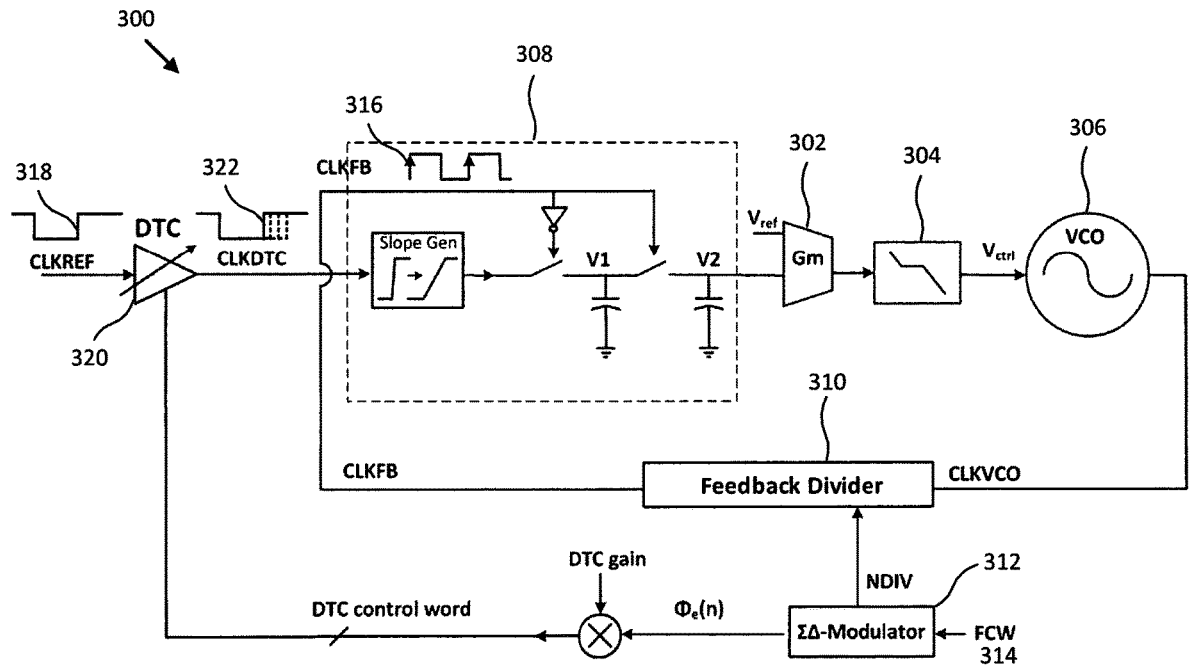
FIG. 3 is a diagram of an analog sampling fractional-N PLL, according to an embodiment.

FIG. 3 is a diagram of an analog sampling fractional-N PLL 300, according to an embodiment. The PLL 300 includes a Gm circuit 302, and analog loop filter 304, a VCO 306, an SPD 308, and a DTC 320. The PLL 300 also includes a feedback divider 310 (e.g., a multi-modulus divider) and a ΣΔ-modulator 312.

For a fractional-N PLL, the ratio of the VCO 306 output frequency CLKVCO to a reference clock frequency CLKREF, such as a frequency control word (FCW) 314, is a rational number that can be typically expressed as $K/2^M$, where K and M are positive integer values. The feedback divider 310 is controlled by a ΣΔ-modulator 312 to generate the fractional division ratio $K/2^M$. Due to the fractional-N division, the clock edges 316 of CLKFB contain the quantization noise. For a mash1-1 ΣΔ-modulator, the output CLKFB will have a jitter up to about $\pm 2 \cdot T_{vco}$, in which $T_{vco}$ is the period of the frequency divider 310 input clock (e.g., CLKVCO). Thus, the rising edges 318 of CLKREF are not naturally aligned to the rising edges 316 of CLKFB when loop 300 is locked. The quantization noise in CLKFB exceeds the linear operation range of the SPD 308 and needs to be removed prior to the SPD 308 to ensure the phase lock of the loop 300. As the fractional-N divider quantization noise is known and it is generated by the ΣΔ-modulator 312, the same amount of quantization noise may be applied to the CLKREF path via a DTC 320 so that the phase error between CLKDTC 322 and CLKFB 316 is free from the quantization noise, which is similar to the integer-N PLL case shown in FIG. 1.

Figure 4:
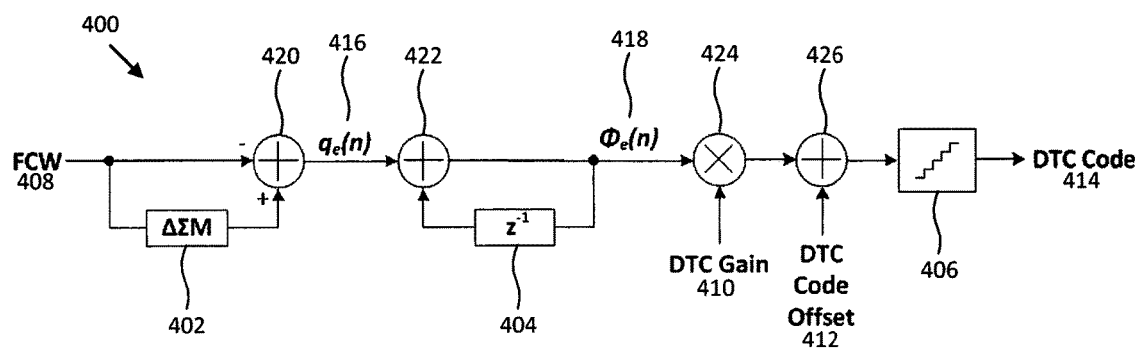
FIG. 4 is a diagram of a DTC control word generation circuit, according to an embodiment.

FIG. 4 is a diagram of a DTC control word generation circuit 400, according to an embodiment. The DTC control word generation circuit 400 includes a ΣΔ-modulator 402, a digital integrator 404 and a quantizer 406. The time delay of the DTC (e.g., DTC 320) is controlled by a DTC code word 414 generated by the DTC control word generation circuit 400. A FCW 408 may be input into the generation circuit 400 and may specify the desired frequency synthesis ratio. A ΣΔ-modulator 402 may generate a digital sequence with a time-averaged ratio that is identical to the FCW 408. The frequency quantization error sequence $q_e(n)$ 416 is the difference between the ΣΔ-modulator 402 output and the FCW 408. To translate from a frequency quantization error sequence 416 to a phase error sequence $\Phi_e(n)$ 418, a digital integrator (404 and 422) may be employed and the phase error sequence 418 may be generated (with digital integrator 404 and accumulator 422). For proper cancellation, the expected phase error 418 may be scaled by the DTC gain 410 via a multiplier 424. A DTC code offset 412 is added via adder 426 to shift the DTC code 414 to meet the DTC input range requirement. The extra delay introduced due to the addition of the DTC code offset 412 is equivalent to a fixed delay introduced to CLKREF, and it does not affect PLL operation.

Figure 5:
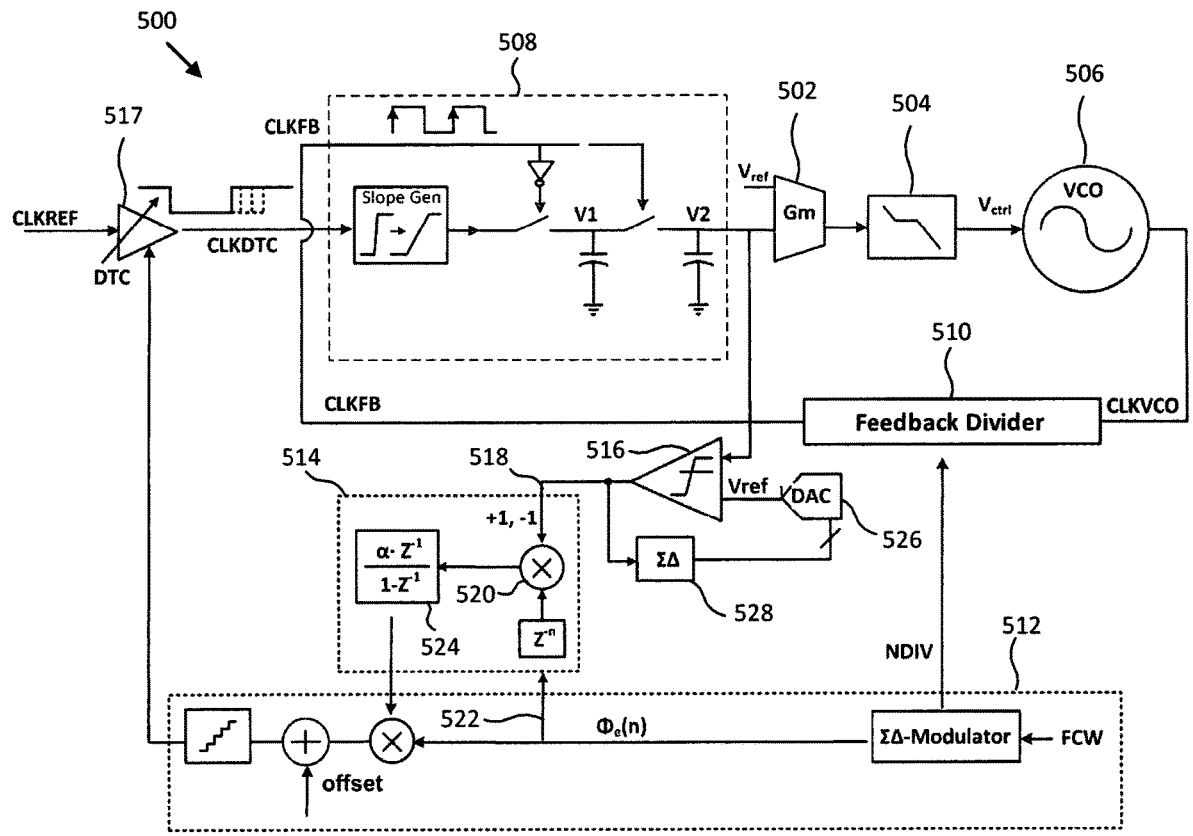
FIG. 5 is a diagram of a DTC-based analog sampling fractional-N PLL, according to an embodiment.

FIG. 5 is a diagram of a DTC-based analog sampling fractional-N PLL 500, according to an embodiment. The PLL 500 includes a Gm circuit 502, an analog loop filter 504, a VCO 506, and SPD 508, a feedback divider 510, a DTC code word generation circuit 512, a DTC gain calibration circuit 514, a voltage comparator 516, and a DTC 517.

The basic form of DTC gain calibration circuit 514 is carried over from a digital sampling fractional-N PLL. The operation principle is based on least mean square (LMS) regression. The 1-bit phase error 518 (+1 when CLKREF leads CLKFB and −1 vice versa) is correlated via multiplier 520 with a delayed version of ΣΔ quantization noise 522 through a digital accumulator 524. Once the DTC gain is converged to the correct value, the quantization noise will be fully compensated by the DTC and thus, the 1-bit digital phase error 518 would have no correlation with ΣΔ quantization noise 522.

In the PLL 500, the voltage comparator 516 is used to generate the 1-bit digital phase error 518 (e.g., the sign of phase error). When the loop 500 is locked, the sampled voltage V2 will be equal to the reference voltage Vref to ensure the net current output of the Gm circuit 502 is zero. Therefore, comparing V2 with Vref by the voltage comparator 516 generates the sign of phase error for calibration purposes. A Gm circuit 502 has a finite input referred to as DC offset, which will be absorbed in the settled loop and will result in the average voltage of $V2=Vref+V_{offset}$ to satisfy the net current output of the Gm circuit 502 to be zero. In addition, the voltage comparator 516 has offset. Both aforementioned offsets need to be removed to obtain the proper 1-bit phase error sign 518 for calibration. Otherwise, the error sign 516 will stay at "1" or "−1" for most of the time (i.e., dominated by the offset) and swamps the actual phase error between the two clocks for DTC gain calibration.

A DAC 526 can be used to adjust the Vref dynamically in order to remove the DC offset. The digital control of the DAC is generated by feeding the comparator output 518 to a digital ΣΔ-modulator 528 to get its DC (or low frequency) component. An example of such offset removal is described in related U.S. Provisional Application Ser. No. 62/613,898 entitled "System and Method for Fast-Converging Digital-To-Time Converter (DTC) Gain Calibration Technique for DTC-Based Analog Fractional-N Phase Lock Loop (PLL)", the entire contents of which are incorporated herein by reference.

Figure 6:
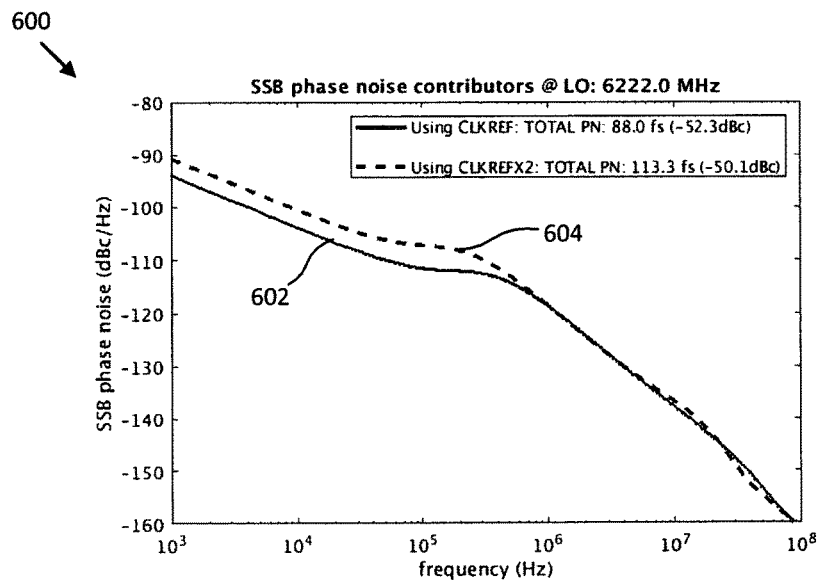
FIG. 6 is a graph tracking the phase noise performance of a PLL, according to an embodiment.

FIG. 6 is a graph 600 tracking the phase noise performance of a PLL, according to an embodiment. The in-band phase noise of the DTC-based sampling PLL can be further improved by doubling the reference clock. In graph 600, line 602 tracks performance of a PLL with a normal reference clock rate, while line 604 tracks performance of a PLL with a doubled reference clock rate. The integrated phase noise can improve by about 2 dB with doubled reference clock rate. The noise performance of each circuit block is not changed. Only the reference clock rate is changed by a factor of two for comparison.

Conventional implementations such as those described above present some issues. For stringent requirements in advanced wireless applications, integrated phase noise (PN) needs to be further improved for DTC-based analog PLL. In traditional PLL topologies, in-band PN is limited by the charge-pump (CP) or Gm noise. CP and Gm performance may be limited by process and power consumption budgets. Although using a reference clock doubler may improve PLL in-band PN by about 3 dB, its duty cycle error is problematic, causing high reference spurs and failure of DTC gain calibration.

As explained above, to further improve the integrated phase noise (IPN) of a PLL, a clock doubler may be used to double the reference clock rate and improve the PLL in-band PN by 3 dB. However, a reference clock (CLKREF) typically does not have an ideal 50% duty cycle and the reference clock duty cycle error results in a systematic period mismatch between even and odd cycle clocks in the doubled clock (CLKREFX2). The even/odd period mismatch introduces reference spur at the offset frequency of CLKREF that may violate the emission mask and also contribute to the total integrated PN in a conventional PLL topology.

Moreover, for a DTC-based fractional-N PLL architecture, the even/odd period mismatch may exceed the linear operation range of the SPD. Therefore, the mismatch disturbs the loop dynamics and severely degrades the phase noise performance. In addition, the presence of the reference clock duty cycle error also disrupts the DTC gain calibration loop, compromising its convergence accuracy or even causing convergence failure. Therefore, when a reference doubler is used, the DTC-based PLL phase noise performance and operation may be degraded severely.

According to an embodiment, a duty cycle compensation loop is provided that allows the DTC gain loop to converge to the desired value in the reference doubler mode and improve the integrated phase noise of the PLL.

FIGS. 7A, 7B, 7C, and 7D are graphs 700, 720, 740, and 760 tracking PLL performance, according to an embodiment. When reference clock duty cycle error is present, the DTC gain calibration and the PLL phase noise (PN) performance is degraded in a DTC-based fractional-N analog PLL. Graph 700 tracks PLL performance in an example with a 0.2% duty cycle error. A strong spur 702 is present at a reference frequency (Fref) offset while many other fractional spurs 704 are observed when the duty cycle increases. Graph 720 tracks PLL performance in an example with a 1% duty cycle error. A strong spur 722 is present at Fref offset while fractional spurs 724 are observed when the duty cycle increases, and the in-band PN 726 increases. Graph 740 tracks PLL performance in an example with a 2% duty cycle error. A strong spur 742 is present at Fref offset while fractional spurs 744 are observed when the duty cycle increases, and the in-band PN 746 increases. Graph 760 tracks PLL performance in an example with a 6% duty cycle error. A strong spur 762 is present at Fref offset while fractional spurs 764 are observed when the duty cycle increases, and the in-band PN 766 increases. The in-band PNs 706, 726, 746, and 766 are degraded due to the inaccurate DTC gain calibration results in the presence of duty cycle error.

Figure 8:
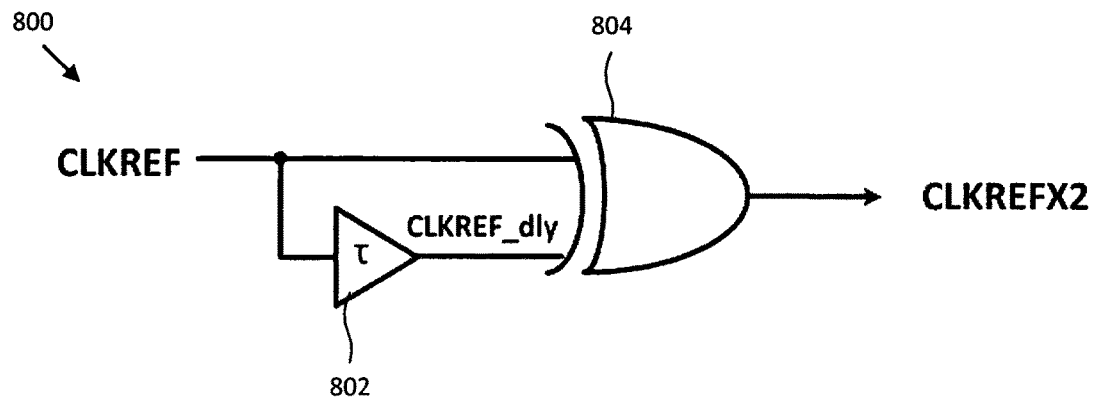
FIG. 8 is a diagram of a reference clock doubler, according to an embodiment.
Figure 9:
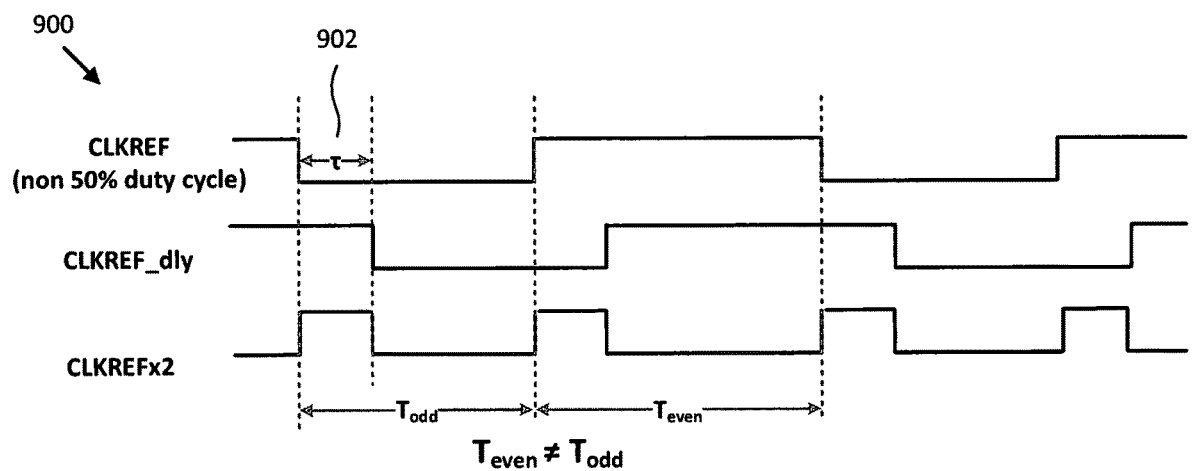
FIG. 9 is a graph tracking the operation with a reference clock doubler, according to an embodiment.

FIG. 8 is a diagram of a reference clock doubler 800, according to an embodiment. FIG. 9 is a graph 900 tracking operation with a reference clock doubler, according to an embodiment. The reference clock doubler 800 includes a delay 802 and an XOR gate 804. The reference clock duty cycle error introduces even/odd period mismatch in the clock doubler 800 (CLKREFX2). As shown in graph 900, when the doubler 800 CLKREFX2 is used in a PLL as the new reference clock, it introduces an additional phase error 902 between the reference clock and feedback clock. Generally, when the reference clock leads the feedback clock, the phase error is positive and when the reference clock lags behind the feedback clock, the phase error is negative (although the positive/negative attributes to the phase error may be defined alternately). Due to the duty cycle error, the phase error alternates between positive and negative. The attribute of the phase error alternating between positive and negative is used to correlate a sampled phase error with cycle status data to quickly identify the duty cycle error accurately.

According to an embodiment, a digital duty cycle correction system is provided that senses the duty cycle error (also referred to herein as even/odd period mismatch in CLKREFX2) indirectly from a sampler based phase detector output in a PLL instead of directly detecting the error from reference clock doubler output. The output voltage of the sampler is digitized by a voltage comparator to generate a 1-bit signed data. Then, a digital signal processing technique is used to filter the data and to identify the duty cycle error based on an LMS-regression loop. The digital signal processing includes a digital differentiator and a correlator (a bit shifter and an accumulator) that are very low complexity and low cost. The digital differentiator helps to remove the DC component in the data, making the duty cycle calibration loop insensitive to the comparator offset, sampler offset, and any other analog voltage offset introduced by the analog components in a PLL. The correlator correlates the filtered data with a 1-bit signed signal indicating the cycle status (even cycle is "1" and odd cycle is "−1", although other value representations of the even cycle and the odd cycle may be utilized depending on the system implementation). The correlation loop keeps on adapting until the two inputs of the correlator have no more correlation, which indicates convergence. It can converge fast and robustly in the presence of DTC gain error and initial phase error in the loop.

Figure 10:
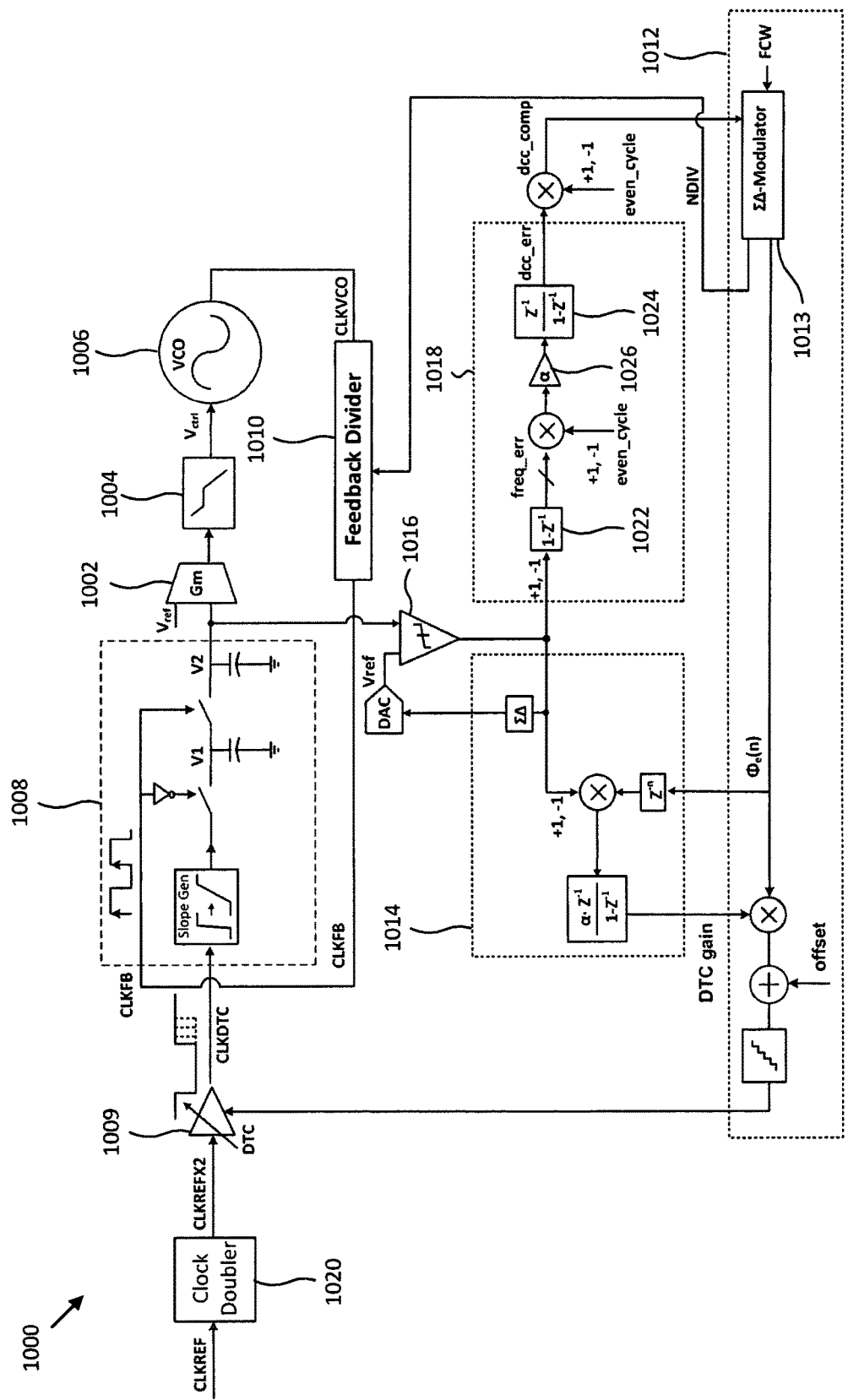
FIG. 10 is a diagram of a DTC-based fractional-N analog PLL, according to an embodiment.

FIG. 10 is a diagram of a DTC-based fractional-N analog PLL 1000, according to an embodiment. The PLL 1000 includes a Gm circuit 1002, an analog loop filter 1004, a VCO 1006, an SPD 1008, a DTC 1009, a feedback divider 1010, and a DTC code word generation circuit 1012. The PLL 1000 also includes a DTC calibration circuit 1014, a comparator 1016, a duty cycle correction circuit 1018 and a reference clock doubler 1020. The sign of the phase error between CLKREFX2 and CLKFB is obtained from the voltage comparator 1016 output ("1": phe_sign=+1 and "0": phe_sign=−1). The phe_sign is further differentiated to determine a digital frequency error (freq_err) that is proportional to the period difference between the even and odd cycles of CLKREFX2 ($T_{even}-T_{odd}$), as shown in FIG. 9.

Figure 11:
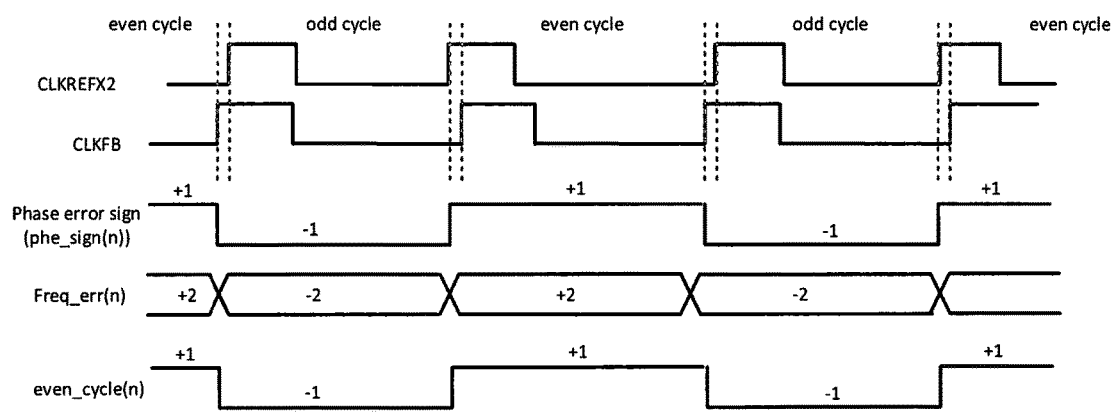
FIG. 11 is a graph tracking the operation of a PLL, according to an embodiment.
Figure 12:
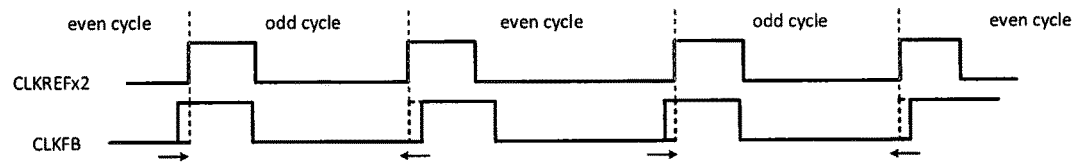
FIG. 12 is a graph showing duty cycle correction, according to an embodiment.

FIG. 11 is a graph 1100 tracking operation of a PLL, according to an embodiment. FIG. 12 is a graph 1200 showing duty cycle correction, according to an embodiment. The graph 1100 is a plot of CLKREF duty cycle error and phase relation between CLREFX2 and CLKFB with and without duty cycle correction. CLKREF has a duty cycle greater than 50% and the period of the even cycle is larger than the period of the odd cycle in the doubled clock. Although the periods depicted are defined as even and odd cycles, the cycles may be labelled alternatively according to system implementation. Due to the duty cycle error, freq_err (n) is positive when n is an even cycle and freq_err(n) is negative when n is an odd cycle. Thus, when a duty cycle error is present, freq_err(n) has a strong correlation with the status of current cycle (even or odd). The LMS based correlation loop (e.g., the duty cycle correction circuit 1018) can be used for duty cycle calibration to shift CLKFB, as shown in graph 1200, thereby providing correction to the duty cycle error.

Figure 13:
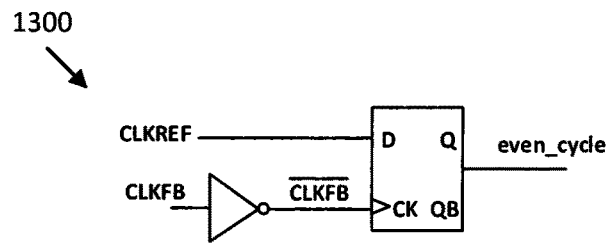
FIG. 13 is a diagram of a cycle status signal generation circuit, according to an embodiment.
Figure 14:
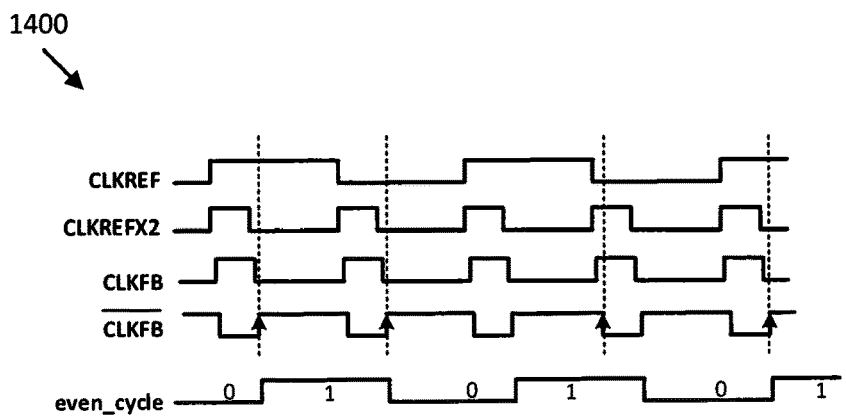
FIG. 14 is a graph tracking operation of a cycle status signal generation circuit, according to an embodiment.

FIG. 13 is a diagram of a cycle status signal generation circuit 1300, according to an embodiment. FIG. 14 is a graph 1400 tracking operation of the cycle status signal generation circuit 1300, according to an embodiment. Referring to FIGS. 13 and 14, the cycle status signal generation circuit 1300 operates with an undoubled reference clock. The undoubled reference clock is sampled by FBCLK and the output shown in graph 1400 as "even_cycle" is alternating between "0" and "1" to indicate the status of the cycle.

Figure 15:
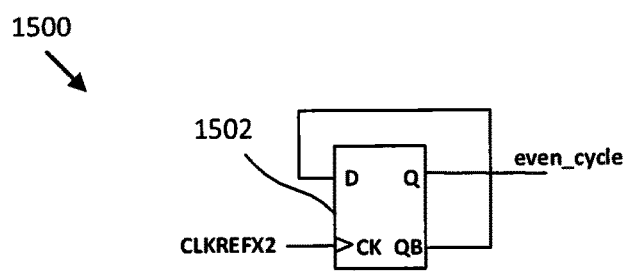
FIG. 15 is a diagram of a cycle status signal generation circuit, according to an embodiment.
Figure 16:
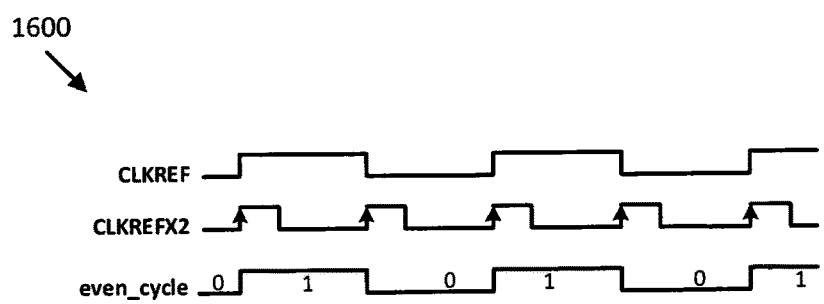
FIG. 16 is a graph tracking operation of a cycle status signal generation circuit, according to an embodiment.

FIG. 15 is a diagram of a cycle status signal generation circuit 1500, according to an embodiment. FIG. 16 is a graph 1600 tracking operation of the cycle status signal generation circuit 1500, according to an embodiment. Referring to FIGS. 15 and 16, the cycle status signal generation circuit 1500 includes a counter 1502 and operates with a doubled reference clock. CLKREF is fed to the 1-bit counter 1502 and the counter output shown in graph 1600 as "even_cycle" can be used as the indication of the status of the cycle.

Referring back to FIG. 10, the calibrated duty cycle error (dcc_err) in PLL 1000 may then be fed to the ΣΔ-modulator 1013 of the code word generator 1012 to adjust the phase of the FBCLK. For an even cycle of FBCLK, its rising edge is pushed back by the amount of dcc_err and for the odd cycle, the rising edge is pulled in by the same amount so that FBCLK matches the even/odd cycle mismatch of the CLKREFX2 and their phase error will be free from the duty cycle error (as shown in graph 1200 of FIG. 12). The direction of the phase adjustment may controlled by an even_cycle signal that alternates between +1 and −1. As one CLKREF generates one even cycle of CLKREFX2 and one odd cycle of CLKREFX2, the net dcc_comp fed to the ΣΔ-modulator 1013 is zero for each CLKREF cycle. Therefore, the dcc_comp only changes the phase of the CLKFB but not the frequency. The CLKFB frequency is controlled by the FCW. Once the dcc_err is converged to the correct value, the phe_sign will be free from the duty cycle error and thus, the freq_err has no correlation with cycle status.

The digital duty cycle correction circuit 1018 can converge in the presence of DTC gain error. Due to the $(1-Z^{-1})$ processing of the phe_sign data, the error information at Fref/2 rate is emphasized. Therefore, unlike the DTC gain calibration circuit 1014, the duty cycle correction circuit 1018 is not sensitive to the Gm offset and the comparator 1016 offset. It is also not sensitive to the initial frequency error and the phase error in the loop as the spectra of these errors are concentrated at the DC to Fref/2 and the duty cycle error introduced freq_err is mainly located at Fref/2 rate, which may be extracted via correlation with the cycle status signal (even_cycle), which is also at the Fref/2 rate.

Figure 17:
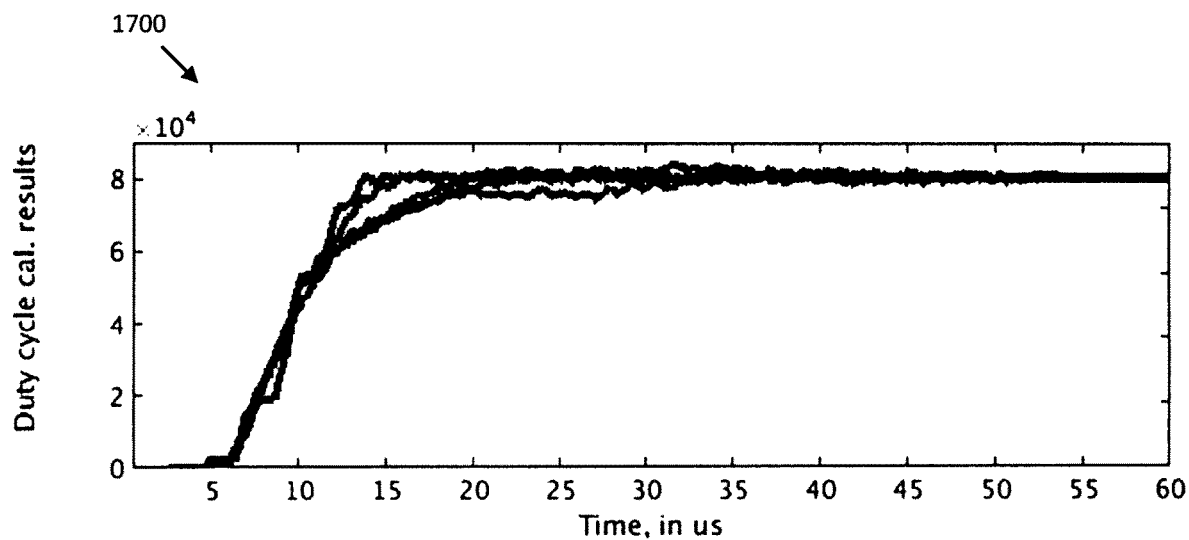
FIGS. 17 and 18 are graphs of duty cycle compensation performance, according to an embodiment.
Figure 18:
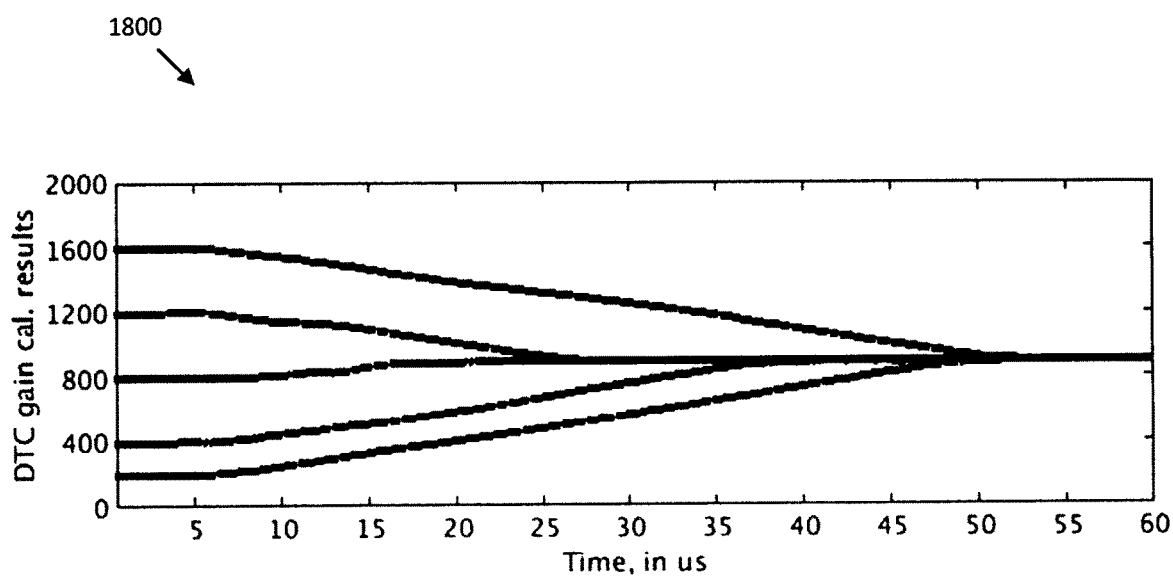

FIGS. 17 and 18 are graphs of duty cycle compensation performance, according to an embodiment. Referring to FIGS. 17 and 18, graph 1700 shows duty cycle calibration convergence, and graph 1800 shows DTC gain calibration convergence in a system where both a duty cycle calibration circuit and a DTC gain calibration circuit are implemented. The convergence trajectory for the duty cycle correction loop with various initial DTC gain value is shown. The correct DTC gain value is 865. The initial value of DTC gain is set away from the correct value intentionally, as there is no information of DTC gain before the DTC gain calibration converges. It is noted that the duty cycle correction loop tracked in graph 1700 settles within about 40 us regardless of the deviation of the DTC gain value (DTC gain initial value is set to 0, 200, 400, 800, 1200, and 1400 respectively, as shown in graph 1800). Due to the duty cycle correction loop, the DTC gain calibration loop also converges as shown in graph 1800 after duty cycle error is compensated. Both calibration loops are operated in background simultaneously to track the temperature and voltage variations, and thus ensure the superior PLL performance over process, temperature and voltage (PVT) variations.

Figure 19:
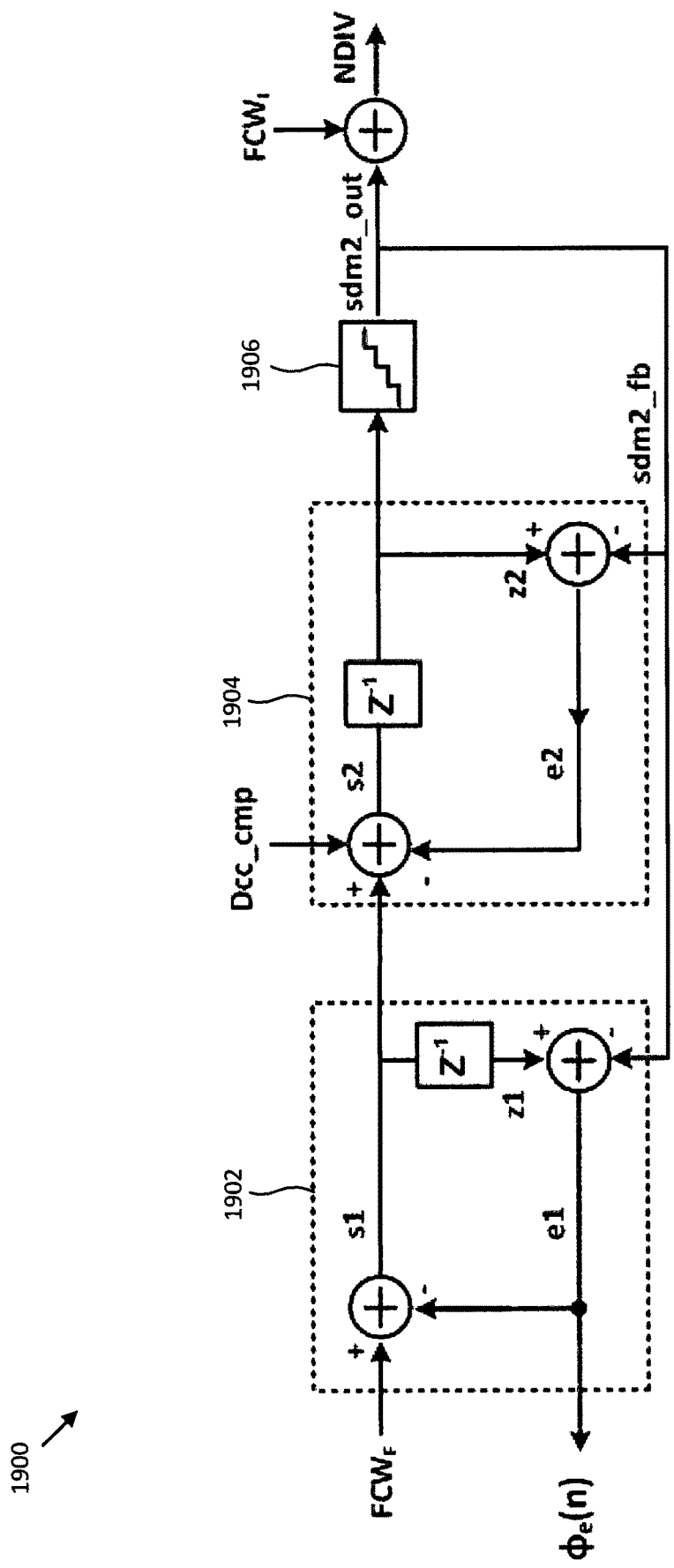
FIG. 19 is a diagram of a ΣΔ-modulator, according to an embodiment.

FIG. 19 is a diagram of a ΣΔ-modulator 1900, according to an embodiment. The ΣΔ-modulator 1900 with duty cycle compensation input dcc_cmp and $\Phi_e$ output for DTC gain calibration includes digital integrators 1902 and 1904, as well as a quantizer 1906. The ΣΔ-modulator 1900 has two inputs: $FCW_F$ (fractional part of FCW) and dcc_cmp. The dcc_cmp used for duty cycle correction also introduces the quantization noise in the CLKFB, similar to $FCW_F$. This is also captured in the $\Phi_e$ and be eventually cancelled via the DTC path. $\Phi_e$ may be tapped out from the ΣΔ-modulator 1900 to save a digital integrator (e.g., digital integrator 1902).

The duty cycle correction circuit 1018 may include a digital differentiator 1022 and an accumulator 1024. The convergence speed of the duty cycle correction loop is determined by the bandwidth of the adaptation loop, which is proportional to the gain factor α, as shown in the PLL 1000 of FIG. 10. A larger α corresponds to a larger bandwidth and fast settling of the duty cycle correction. A smaller α is desired to minimize the quantization noise introduced by the correction circuit 1018. To speed up the calibration, a large α may be applied initially and then switched to a smaller α to reduce the quantization noise at steady state. The switchover may be controlled by a digital counter based timer. The gain factor may be implemented as a simple bit shift instead of a real multiplier 1026 to save hardware.

The maximum duty cycle error that can be corrected may be extended by increasing the number of integer bits in the fixed number dcc_comp and the correction accuracy may be improved by increasing the fractional bits in dcc_comp. The duty cycle error for CLKREF (crystal oscillator and temperature compensated crystal oscillator (TXCO) with buffers and routing) is within hundreds of picoseconds including process voltage temperature (PVT) variation and parts variation.

The duty cycle calibration circuit 1018 improves PLL phase noise and DTC gain calibration accuracy. The duty cycle calibration circuit 1018 requires almost no additional hardware in the analog part of the loop and achieves fast and accurate correction without any additional noise or spurious tones. The maximum duty cycle error can be calibrated can be easily extended to even >±10% of the CLKREF period.

The duty cycle calibration circuit 1018 may sense the reference clock duty cycle error (or even/odd period mismatch in the doubler reference clock) from the sampler based phase detector 1008 output in the PLL 1000. The sampler 1008 may be in the phase detection part of the PLL 1000 and contains the phase error information between the reference clock and the feedback clock. The output voltage of the sampler is digitized by a voltage comparator 1016 to get a 1-bit signed data for the digital calibration. The same comparator 1016 may also be used for the DTC gain calibration circuit 1014 and thus, no extra analog circuits are required for error sensing. Therefore, it has negligible hardware cost and power consumption. The digital calibration circuits are simple and implemented in digital flow, consuming negligible area and power.

The comparator 1016 output includes all the phase error information in the PLL 1000, such as reference clock duty cycle error introduced phase error, DTC gain error introduced phase error, analog loop component thermal and flicker noise introduced phase error, as well as comparator offset and Gm offset. To extract the duty cycle error part, a digital differentiator $(1-Z^{-1})$ 1022 may be utilized to filter the comparator 1016 output first before further processing, emphasizing the duty cycle error that is at Fref/2 rate. Therefore, the duty cycle correction circuit 1018 is not sensitive to Gm offset and the comparator 1016 offset. In addition, it adds the orthogonality to the DTC gain calibration circuit 1014. It may operate simultaneously with DTC gain calibration loop circuit 1014 and the initial loop phase locking.

The differentiator 1022 output represents the digital frequency error in the loop and has a strong correlation with the even/odd cycle period mismatch due to the duty cycle error. For example, when the even cycle period is smaller than the odd cycle period, then the frequency error for each even cycle clock will be positive and for each odd cycle will be negative. An LMS regression loop may be employed to correlate the frequency error data with a 1-bit signed signal indicating the cycle status (even cycle is "1" and odd cycle is "−1") to obtain the duty cycle error. The calibrated duty cycle error may then be fed to the ΣΔ-modulator 1013 for multi-modulus divider to adjust the phase of the feedback clock. For the even cycle, the feedback clock phase may be pushed back intentionally by the amount equivalent to half of the duty cycle error. For an odd cycle, the feedback clock may be pulled in by the same amount so that the feedback clock matches the even/odd cycle mismatch in the reference clock path and the phase error seen by the sampler will be free from the duty cycle error. The generation of the cycle status only requires a digital flip-flop.

Figure 20:
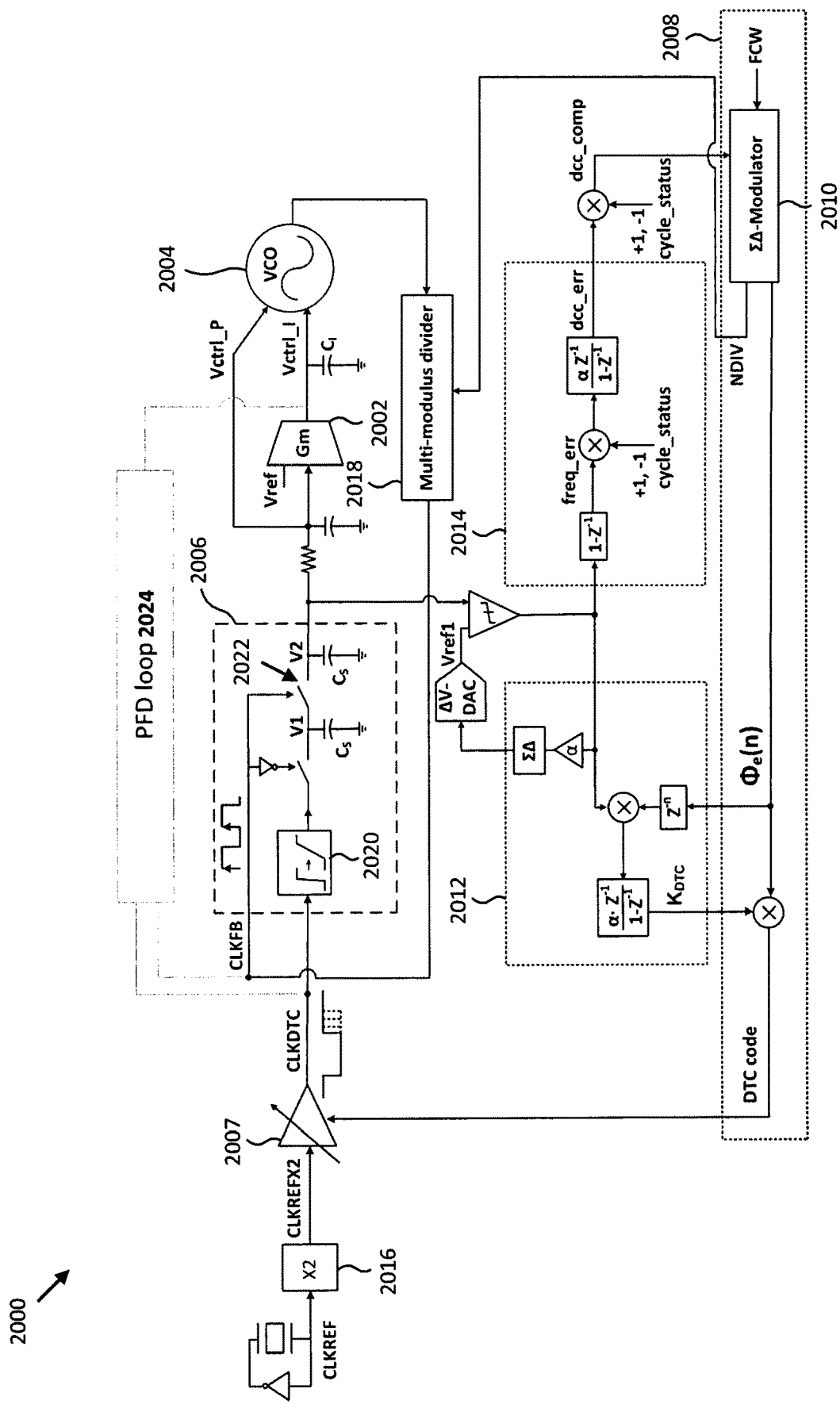
FIG. 20 is a diagram of a PLL, according to an embodiment.

FIG. 20 is a diagram of a PLL 2000, according to an embodiment. The PLL 2000 includes a Gm circuit 2002, a VCO 2004, an SPD 2006, a DTC 2007, a DTC code word generator 2008, a ΣΔ-modulator 2010, a DTC gain calibration circuit 2012, a duty cycle calibration circuit 2014, a reference clock doubler 2016, and a multi-modulus divider 2018 modulated by the ΣΔ-modulator 2010 that is used in the feedback path for fractional-N generation. The quantization noise (QN) of the ΣΔ-modulator 2010 may be scaled by the DTC gain ($K_{DTC}$) and then may modulate the DTC in the reference path to cancel the QN in CLKFB. The clock doubler 2016 doubles the PLL sampling rate to further reduce the in-band phase noise (PN). The reference clock duty cycle error is corrected prior to the SPD 2006 by adjusting the phase of the CLKFB accordingly to match the even/odd mismatch in CLKREFX2. As a result, the SPD 2006 only sees small phase error when locked, similar to the integer-N case.

The SPD 2006 includes a slope generator 2020 and a two-stage sampler. The rising edge of CLKDTC triggers a well-defined voltage ramp with high dV/dt slope, and is sampled by CLKFB, converting the phase error into a sampled voltage. The two-stage sampler 2022 also provides a 1$^{st}$-order discrete time IIR low-pass filtering on the phase error. The sampled voltage is then split into two paths: one path directly tunes the VCO 2004 ($V_{ctrl\_P}$) providing proportional gain ($K_{vco\_P}$), and the other path goes through the $G_M$ circuit 2002 and integration capacitor $C_I$ to generate the $V_{ctrl\_I}$ for VCO 2004. This PI configuration is a natural choice for a sampling PLL. It eliminates the noisy resistor in a conventional analog loop filter. Moreover, the PLL loop bandwidth is mainly determined by the dV/dt slope and the VCO tuning sensitivity, $K_{vco\_P}$, and is insensitive to $G_M$ and $C_I$. This reduces the loop gain variation over PVT, and also relaxes the gain accuracy requirement on $G_M$. A phase frequency detector (PFD) loop 2024 is used to speed up initial frequency/phase acquisition, which is powered down after frequency locking to save power.

The calibrated duty cycle error dcc_comp may be applied to ΣΔ-modulator 2010 to adjust the phase of the FBCLK for compensation. Alternatively, the phase adjustment may be applied to the CLKREFX2 path instead. To do so, the dcc_comp is scaled by the DTC gain and then added to the DTC control word. In this way, both duty cycle correction and ΣΔ-modulator 2010 quantization noise cancellation are done by adjusting the phase of the reference clock via DTC.

Figure 21:
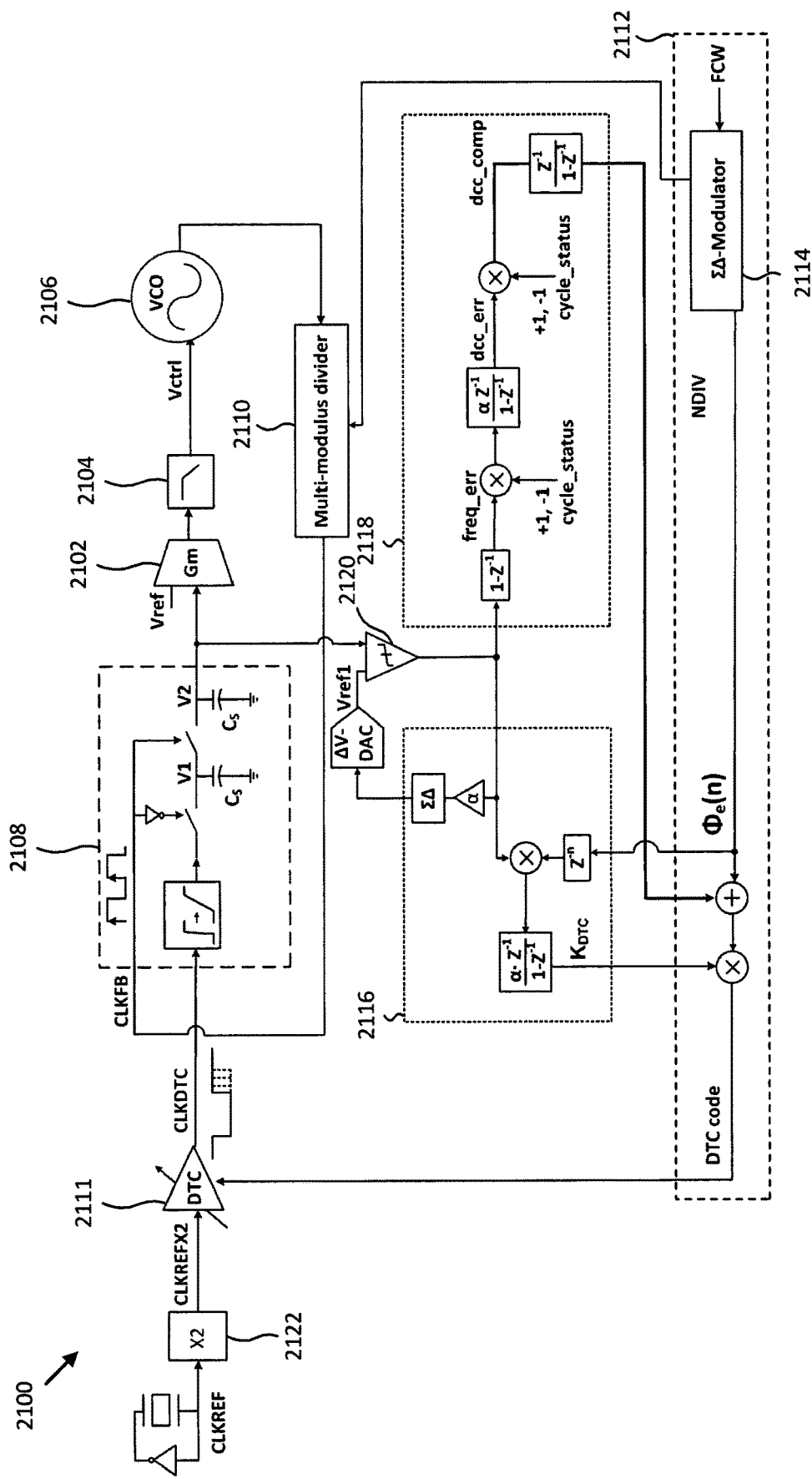
FIG. 21 is a diagram of a PLL, according to an embodiment.

FIG. 21 is a diagram of a PLL 2100, according to an embodiment. The PLL 2100 includes a Gm circuit 2102, an analog loop filter 2104, a VCO 2106, an SPD 2108, a feedback/multi-modulus divider 2110, a DTC 2111, a DTC code word generator 2112, a ΣΔ-modulator 2114, a DTC calibration circuit 2116, a duty cycle calibration circuit 2118, a comparator 2120, and a clock doubler 2122. According to an embodiment, the cycle_status and the freq_err are extracted from the output of the comparator 2120. In the PLL 2100 shown, the cycle_status is determined as a 0 or 1 instead of a +1 and −1. As such, the duty cycle calibration circuit 2118 may be configured to apply duty cycle correction when a preconfigured cycle (e.g., even cycle or odd cycle) is detected as the cycle status. For example, the correction (e.g., the delay of the CLKREF edge) may only be applied for an odd cycle and no correction applied for an even cycle (or vice versa).

Figure 22:
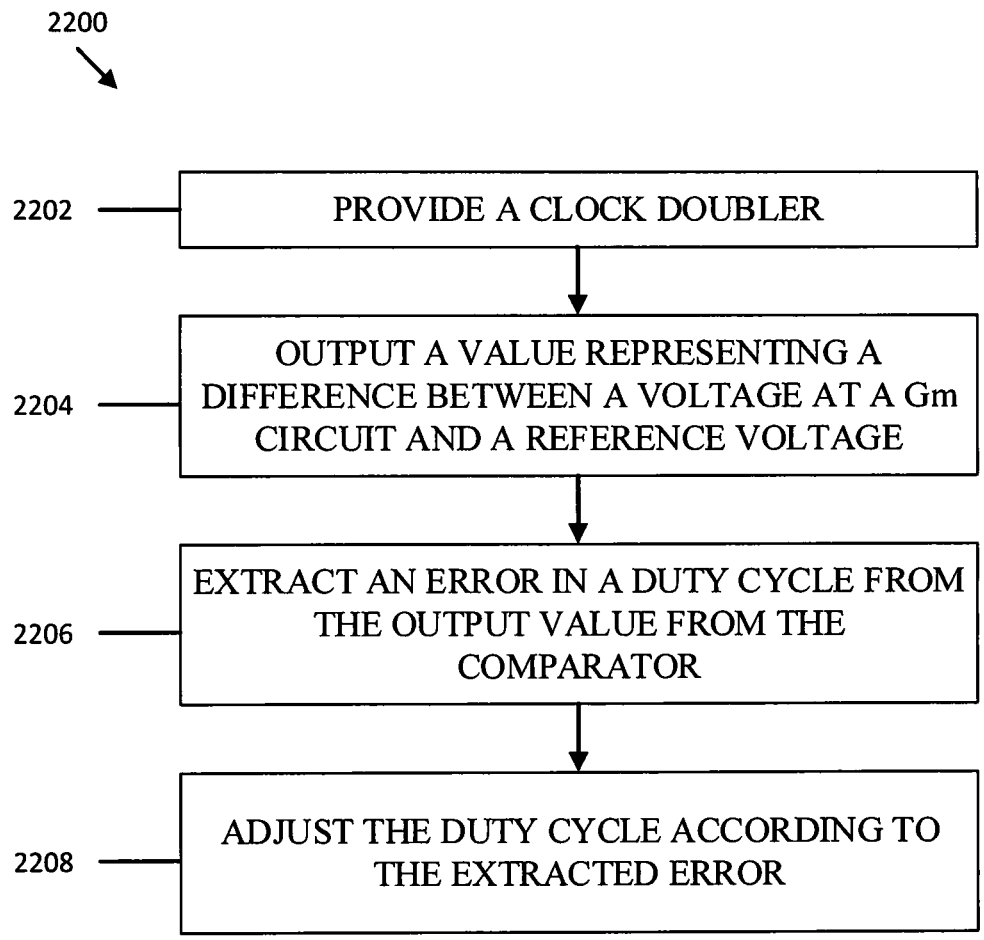
FIG. 22 is a flowchart of a method for duty cycle error correction, according to an embodiment.

FIG. 22 is a flowchart 2200 of a method for duty cycle error correction, according to an embodiment. Steps in a method for duty cycle error correction are shown. At 2202, a reference clock doubler is provided. The reference clock doubler may be provided as part of a PLL such as those described herein.

At 2204, a value representing a difference between a voltage at a Gm circuit and a reference voltage is output. The value may be output by a comparator. The comparator may receive an input from a sampled voltage at a Gm circuit as well as a reference voltage. Due to an offset between the Gm circuit voltage and the reference voltage, the comparator offset may be compensated. For example, a reference voltage generator may dynamically adjust the reference voltage based on the output from the comparator, which indicates a difference between the Gm voltage and the reference voltage. The value output from the comparator may be sent to both a duty cycle calibration circuit and a reference voltage generation circuit.

At 2206, an error in the duty cycle is extracted from the value output from the comparator. The error may be extracted by the duty cycle calibration circuit. The error may be extracted as a frequency error and a dcc_error as described herein.

At 2208, the duty cycle may be adjusted according to the extracted error. The duty cycle may be adjusted by the duty cycle calibration circuit. The adjustment may be performed by delaying a reference clock edge of the duty cycle according to the extracted error.

Figure 23:
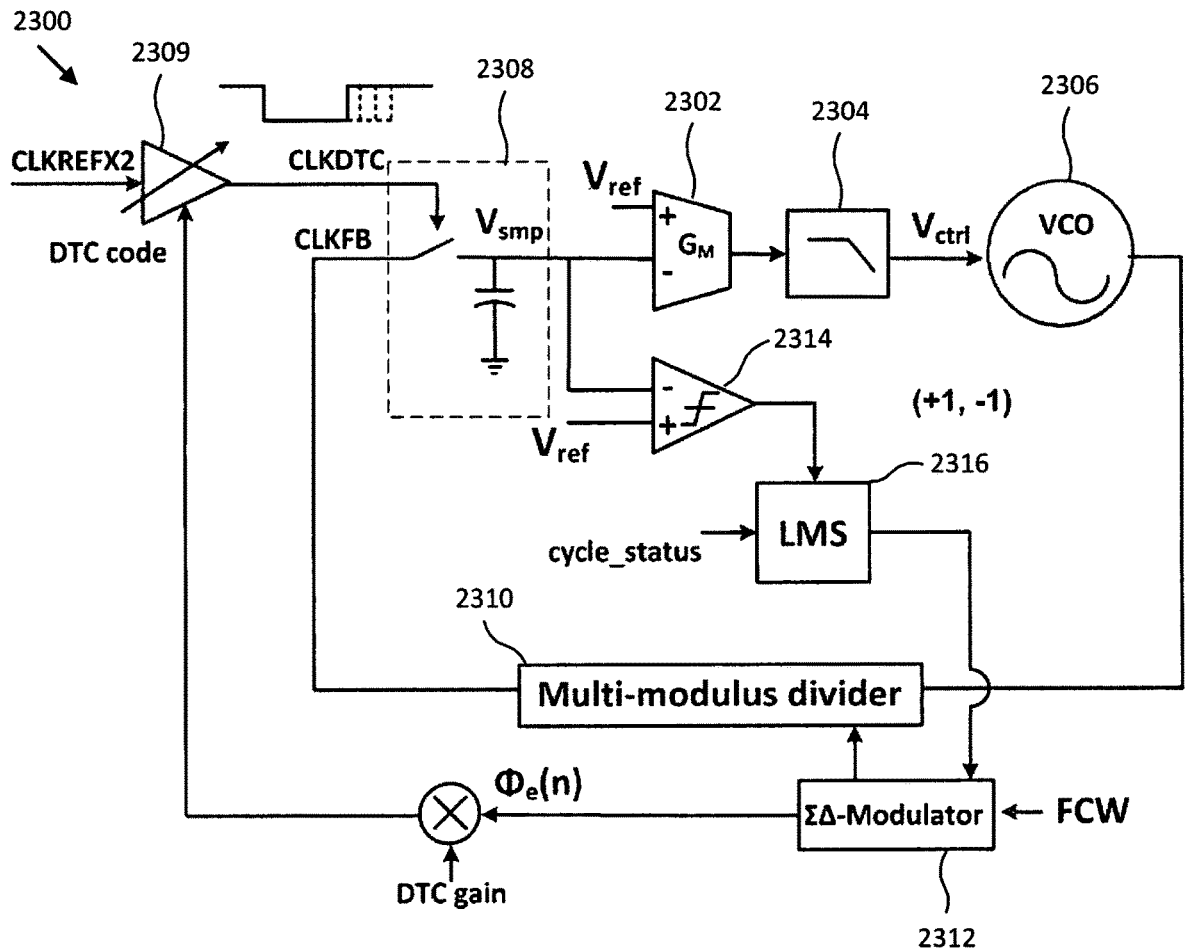
FIG. 23 is a diagram of a PLL, according to an embodiment.
Figure 24:
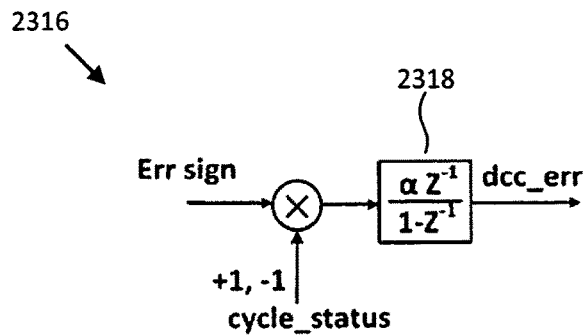
FIG. 24 is a diagram of a least mean square digital correlation circuit, according to an embodiment.

FIG. 23 is a diagram 2300 of a PLL, according to an embodiment. FIG. 24 is a diagram of an LMS digital correlation circuit, according to an embodiment. Referring to FIGS. 23 and 24, a PLL 2300 includes a Gm circuit 2302, an analog loop filter 2304, a VCO 2306, an SPD 2308, a DTC 2309, a feedback/multi-modulus divider 2310, a ΣΔ-modulator 2312, a comparator 2314, and an LMS digital correlation circuit 2316, including a gain factor multiplier 2318. To apply an LMS algorithm, the phase error in an analog PLL may be digitized. A comparator 2314 may be utilized to detect the sign of the phase error. In an embodiment, a single comparator may be used. As the phase error is digitized from a sampling occurring in the background operation, there is little hardware cost for implementing such a correlation circuit 2316 and the implementation may avoid use of a time-to-digital converter (TDC).

Figure 25:
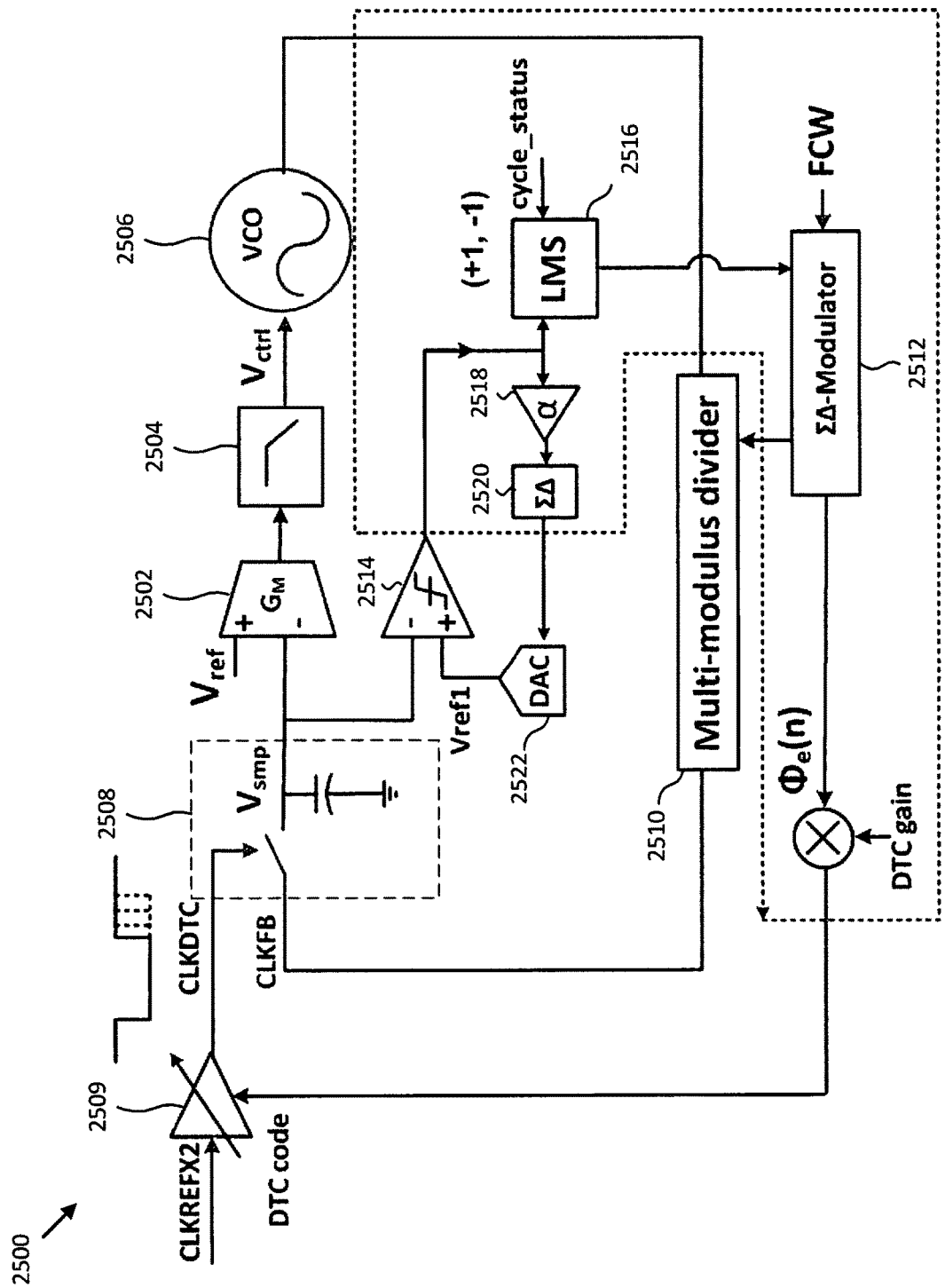
FIG. 25 is a diagram of a PLL, according to an embodiment.

FIG. 25 is a diagram of a PLL 2500, according to an embodiment. The PLL 2500 includes a Gm circuit 2502, an analog loop filter 2504, a VCO 2506, an SPD 2508, a DTC 2509, a feedback/multi-modulus divider 2510, a ΣΔ-modulator 2512, a comparator 2514, an LMS circuit 2516, and a DAC 2522. The PLL 2500 includes an LMS circuit 2516 for duty cycle correction and a dynamically adjustable reference voltage input into the comparator 2514. The DAC 2522 may be utilized to dynamically adjust the reference voltage VREF1 input to the comparator 2514 to compensate for the comparator offset. The comparator offset may refer to the offset or difference between the sampled voltage at the Gm circuit 2502 and the input VREF1 voltage output from the DAC 2522. A ΣΔ-modulator 2520 and a scaling factor 2518 may be utilized with the DAC 2522 to compensate for the comparator offset.

Figure 26:
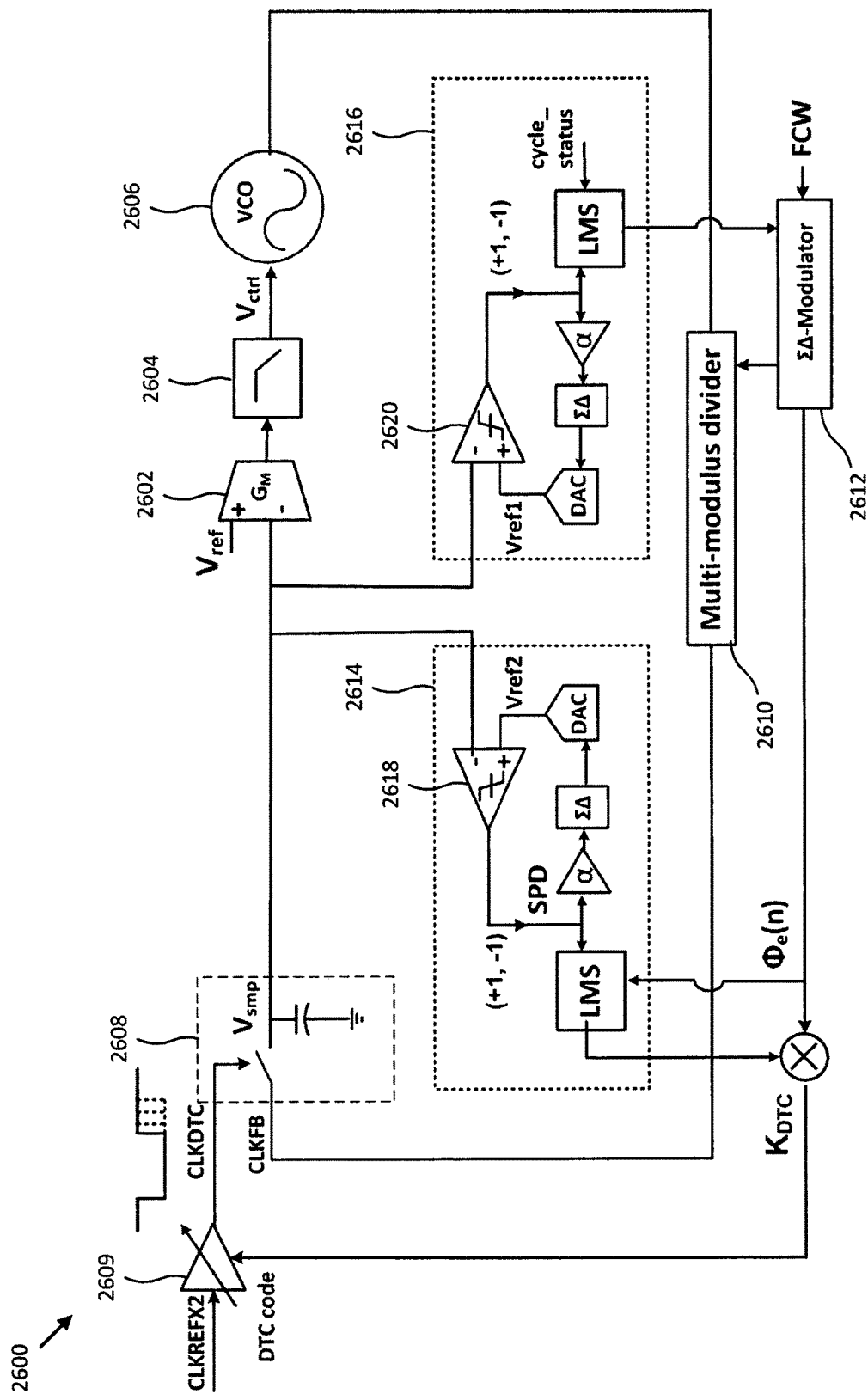
FIG. 26 is a diagram of a PLL, according to an embodiment.

FIG. 26 is a diagram of a PLL 2600, according to an embodiment. The PLL 2600 includes a Gm circuit 2602, an analog loop filter 2604, a VCO 2606, an SPD 2608, a DTC 2609, a feedback/multi-modulus divider 2610, and ΣΔ-modulator 2612. The PLL 2600 also includes a DTC gain calibration circuit 2614 and a duty cycle calibration circuit 2616. In the PLL 2600, each of the DTC gain calibration circuit 2614 and the duty cycle calibration circuit 2616 utilize a comparator 2618 and 2620 respectively, and each calibration circuit individually adjusts for the comparator offset. Both the DTC gain calibration circuit 2614 and the duty cycle calibration circuit 2616 may operate simultaneously and in the background such that the DTC gain calibration circuit 2614 converges to the correct DTC gain value after the duty cycle error is corrected by the duty cycle calibration circuit 2616.

Figure 27:
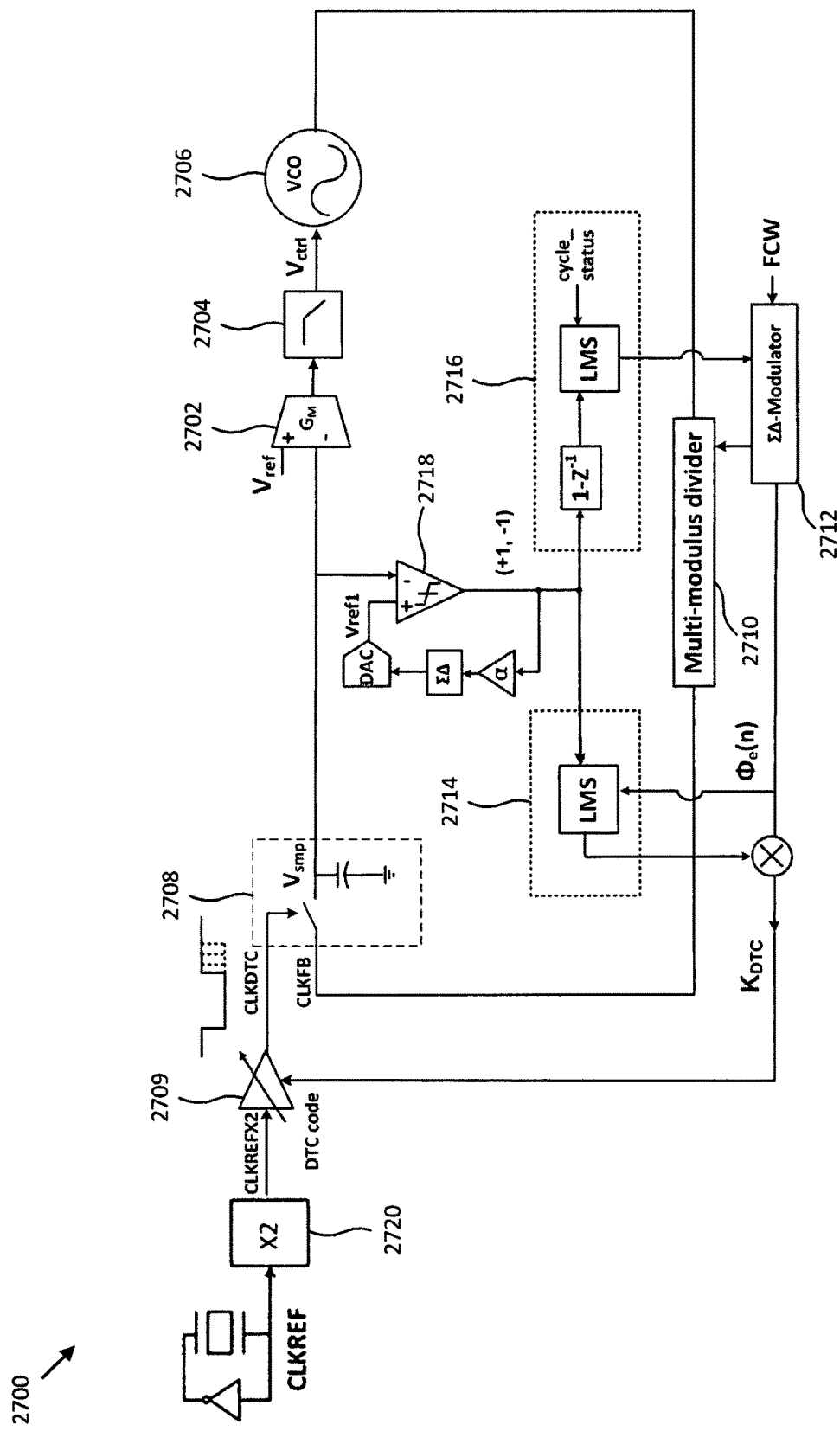
FIG. 27 is a diagram of a PLL, according to an embodiment.

FIG. 27 is a diagram of a PLL 2700, according to an embodiment. The PLL 2700 includes a Gm circuit 2702, an analog loop filter 2704, a VCO 2706, an SPD 2708, a DTC 2709, a feedback/multi-modulus divider 2710, and ΣΔ-modulator 2712, a DTC gain calibration circuit 2714, a duty cycle calibration circuit 2716, a comparator 2718, and a reference clock doubler 2720. PLL 2700 is similar to the PLL 2600 of FIG. 26, except that the duty cycle calibration circuit 2716 and the DTC gain calibration circuit 2714 utilize the same output from a single comparator 2718. The output of the comparator 2718 includes information that can be used for duty cycle calibration and for compensation of the comparator 2718. Such an implementation may further reduce the amount of analog circuits needed for calibration.

Figure 28:
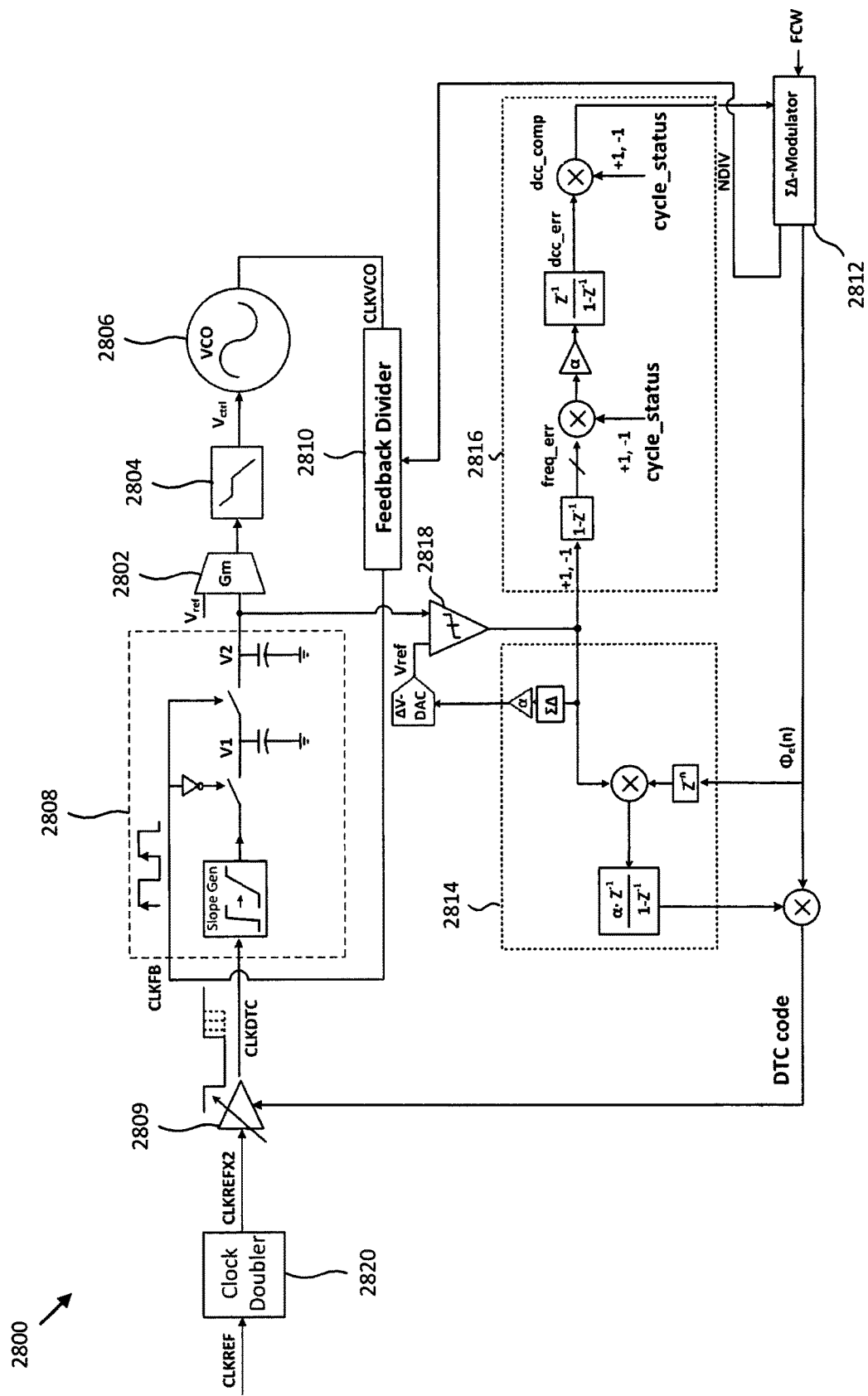
FIG. 28 is a diagram of a PLL, according to an embodiment.

FIG. 28 is a diagram of a PLL 2800, according to an embodiment. The PLL 2800 includes a Gm circuit 2802, an analog loop filter 2804, a VCO 2806, an SPD 2808, a DTC 2809, a feedback/multi-modulus divider 2810, and ΣΔ-modulator 2812, a DTC gain calibration circuit 2814, a duty cycle calibration circuit 2816, a comparator 2818, and a reference clock doubler 2820. The PLL 2800 is similar to the PLL 2100 of FIG. 21, except that the PLL 2100 detects a +1 or a −1 value for the cycle status such that the duty cycle calibration circuit 2816 adjusts the edge of the CLKREF in both even cycles and odd cycles.

Figure 29:
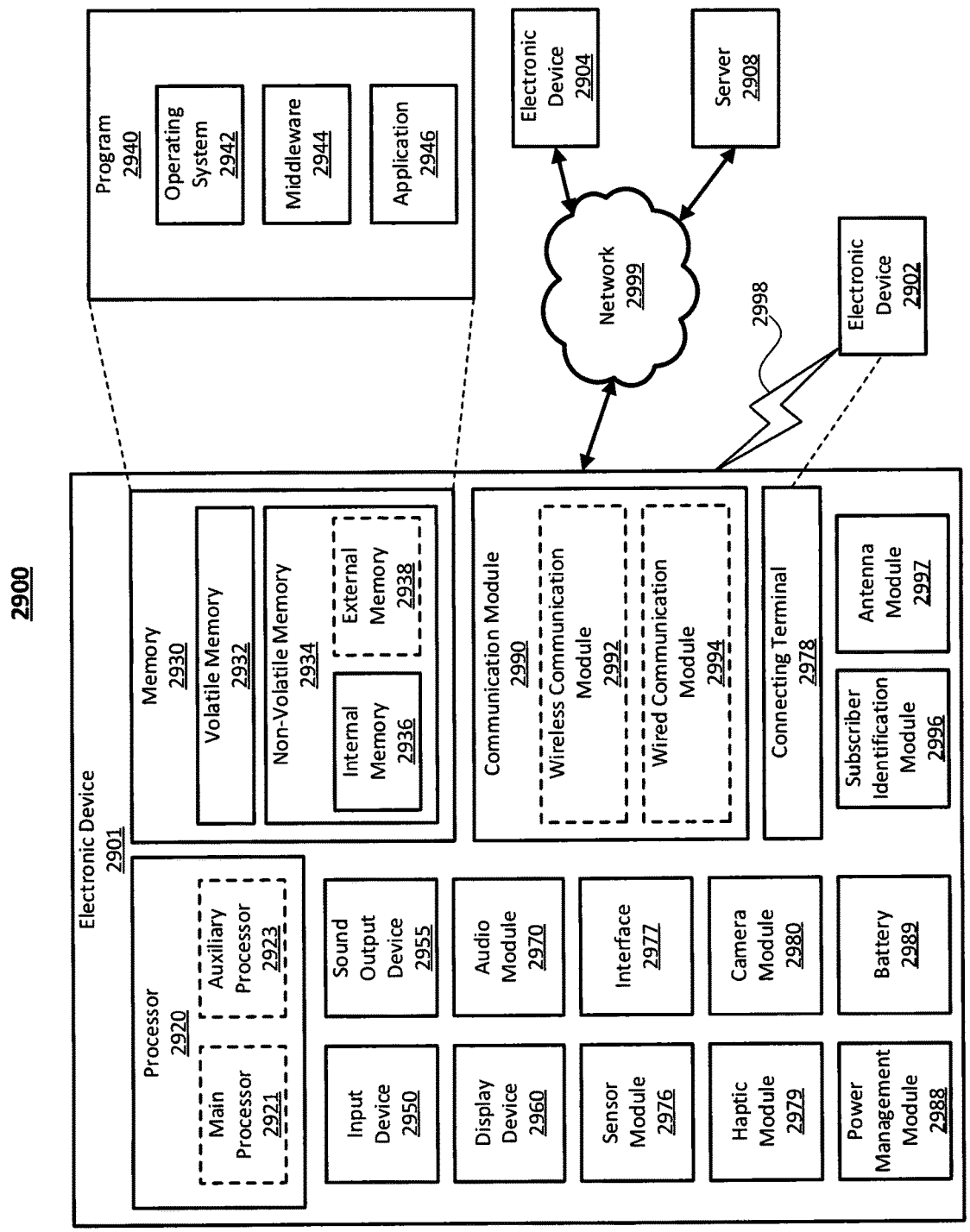
FIG. 29 is a block diagram of an electronic device in a network environment, according to one embodiment.

FIG. 29 is a block diagram of an electronic device 2901 in a network environment 2900, according to one embodiment. Referring to FIG. 29, the electronic device 2901 in the network environment 2900 may communicate with an electronic device 2902 via a first network 2998 (e.g., a short-range wireless communication network), or an electronic device 2904 or a server 2908 via a second network 2999 (e.g., a long-range wireless communication network). According to one embodiment, the electronic device 2901 may communicate with the electronic device 2904 via the server 2908. The electronic device 2901 may include a processor 2920, a memory 2930, an input device 2950, a sound output device 2955, a display device 2960, an audio module 2970, a sensor module 2976, an interface 2977, a haptic module 2979, a camera module 2980, a power management module 2988, a battery 2989, a communication module 2990, a subscriber identification module (SIM) 2996, or an antenna module 2997. In one embodiment, at least one (e.g., the display device 2960 or the camera module 2980) of the components may be omitted from the electronic device 2901, or one or more other components may be added to the electronic device 2901. In one embodiment, some of the components may be implemented as a single integrated circuit (IC). For example, the sensor module 2976 (e.g., a fingerprint sensor, an iris sensor, or an illuminance sensor) may be embedded in the display device 2960 (e.g., a display).

The processor 2920 may execute, for example, software (e.g., a program 2940) to control at least one other component (e.g., a hardware or a software component) of the electronic device 2901 coupled with the processor 2920, and may perform various data processing or computations. According to one embodiment, as at least part of the data processing or computations, the processor 2920 may load a command or data received from another component (e.g., the sensor module 2976 or the communication module 2990) in volatile memory 2932, process the command or the data stored in the volatile memory 2932, and store resulting data in non-volatile memory 2934. According to one embodiment, the processor 2920 may include a main processor 2921 (e.g., a central processing unit (CPU) or an application processor (AP)), and an auxiliary processor 2923 (e.g., a graphics processing unit (GPU), an image signal processor (ISP), a sensor hub processor, or a communication processor) that is operable independently from, or in conjunction with, the main processor 2921. Additionally or alternatively, the auxiliary processor 2923 may be adapted to consume less power than the main processor 2921, or execute a particular function. The auxiliary processor 2923 may be implemented as being separate from, or a part of, the main processor 2921.

The auxiliary processor 2923 may control at least some of the functions or states related to at least one component (e.g., the display device 2960, the sensor module 2976, or the communication module 2990) among the components of the electronic device 2901, instead of the main processor 2921 while the main processor 2921 is in an inactive (e.g., sleep) state, or together with the main processor 2921 while the main processor 2921 is in an active state (e.g., executing an application). According to one embodiment, the auxiliary processor 2923 (e.g., an image signal processor or a communication processor) may be implemented as part of another component (e.g., the camera module 2980 or the communication module 2990) functionally related to the auxiliary processor 2923.

The memory 2930 may store various data used by at least one component (e.g., the processor 2920 or the sensor module 2976) of the electronic device 2901. The various data may include, for example, software (e.g., the program 2940) and input data or output data for a command related thereto. The memory 2930 may include the volatile memory 2932 or the non-volatile memory 2934.

The program 2940 may be stored in the memory 2930 as software, and may include, for example, an operating system (OS) 2942, middleware 2944, or an application 2946.

The input device 2950 may receive a command or data to be used by other component (e.g., the processor 2920) of the electronic device 2901, from the outside (e.g., a user) of the electronic device 2901. The input device 2950 may include, for example, a microphone, a mouse, or a keyboard.

The sound output device 2955 may output sound signals to the outside of the electronic device 2901. The sound output device 2955 may include, for example, a speaker or a receiver. The speaker may be used for general purposes, such as playing multimedia or recording, and the receiver may be used for receiving an incoming call. According to one embodiment, the receiver may be implemented as being separate from, or a part of, the speaker.

The display device 2960 may visually provide information to the outside (e.g., a user) of the electronic device 2901. The display device 2960 may include, for example, a display, a hologram device, or a projector and control circuitry to control a corresponding one of the display, hologram device, and projector. According to one embodiment, the display device 2960 may include touch circuitry adapted to detect a touch, or sensor circuitry (e.g., a pressure sensor) adapted to measure the intensity of force incurred by the touch.

The audio module 2970 may convert a sound into an electrical signal and vice versa. According to one embodiment, the audio module 2970 may obtain the sound via the input device 2950, or output the sound via the sound output device 2955 or a headphone of an external electronic device (e.g., electronic device 2902) directly (e.g., wiredly) or wirelessly coupled with the electronic device 2901.

The sensor module 2976 may detect an operational state (e.g., power or temperature) of the electronic device 2901 or an environmental state (e.g., a state of a user) external to the electronic device 2901, and then generate an electrical signal or data value corresponding to the detected state. According to one embodiment, the sensor module 2976 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 2977 may support one or more specified protocols to be used for the electronic device 2901 to be coupled with the external electronic device (e.g., the electronic device 2902) directly (e.g., wiredly) or wirelessly. According to one embodiment, the interface 2977 may include, for example, a high definition multimedia interface (HDMI), a universal serial bus (USB) interface, a secure digital (SD) card interface, or an audio interface.

A connecting terminal 2978 may include a connector via which the electronic device 2901 may be physically connected with the external electronic device (e.g., the electronic device 2902). According to one embodiment, the connecting terminal 2978 may include, for example, an HDMI connector, a USB connector, an SD card connector, or an audio connector (e.g., a headphone connector).

The haptic module 2979 may convert an electrical signal into a mechanical stimulus (e.g., a vibration or a movement) or an electrical stimulus which may be recognized by a user via tactile sensation or kinesthetic sensation. According to one embodiment, the haptic module 2979 may include, for example, a motor, a piezoelectric element, or an electrical stimulator.

The camera module 2980 may capture a still image or moving images. According to one embodiment, the camera module 2980 may include one or more lenses, image sensors, image signal processors, or flashes.

The power management module 2988 may manage power supplied to the electronic device 2901. According to one embodiment, the power management module 2988 may be implemented as at least part of, for example, a power management integrated circuit (PMIC).

The battery 2989 may supply power to at least one component of the electronic device 2901. According to one embodiment, the battery 2989 may include, for example, a primary cell which is not rechargeable, a secondary cell which is rechargeable, or a fuel cell.

The communication module 2990 may support establishing a direct (e.g., wired) communication channel or a wireless communication channel between the electronic device 2901 and the external electronic device (e.g., the electronic device 2902, the electronic device 2904, or the server 2908) and performing communication via the established communication channel. The communication module 2990 may include one or more communication processors that are operable independently from the processor 2920 (e.g., the AP) and supports a direct (e.g., wired) communication or a wireless communication. According to one embodiment, the communication module 2990 may include a wireless communication module 2992 (e.g., a cellular communication module, a short-range wireless communication module, or a global navigation satellite system (GNSS) communication module) or a wired communication module 2994 (e.g., a local area network (LAN) communication module or a power line communication (PLC) module). A corresponding one of these communication modules may communicate with the external electronic device via the first network 2998 (e.g., a short-range communication network, such as Bluetooth™, wireless-fidelity (Wi-Fi) direct, or a standard of the Infrared Data Association (IrDA)) or the second network 2999 (e.g., a long-range communication network, such as a cellular network, the Internet, or a computer network (e.g., LAN or wide area network (WAN))). These various types of communication modules may be implemented as a single component (e.g., a single IC), or may be implemented as multiple components (e.g., multiple ICs) that are separate from each other. The wireless communication module 2992 may identify and authenticate the electronic device 2901 in a communication network, such as the first network 2998 or the second network 2999, using subscriber information (e.g., international mobile subscriber identity (IMSI)) stored in the subscriber identification module 2996.

The antenna module 2997 may transmit or receive a signal or power to or from the outside (e.g., the external electronic device) of the electronic device 2901. According to one embodiment, the antenna module 2997 may include one or more antennas, and, therefrom, at least one antenna appropriate for a communication scheme used in the communication network, such as the first network 2998 or the second network 2999, may be selected, for example, by the communication module 2990 (e.g., the wireless communication module 2992). The signal or the power may then be transmitted or received between the communication module 2990 and the external electronic device via the selected at least one antenna.

At least some of the above-described components may be mutually coupled and communicate signals (e.g., commands or data) therebetween via an inter-peripheral communication scheme (e.g., a bus, a general purpose input and output (GPIO), a serial peripheral interface (SPI), or a mobile industry processor interface (MIPI)).

According to one embodiment, commands or data may be transmitted or received between the electronic device 2901 and the external electronic device 2904 via the server 2908 coupled with the second network 2999. Each of the electronic devices 2902 and 2904 may be a device of a same type as, or a different type, from the electronic device 2901. According to one embodiment, all or some of operations to be executed at the electronic device 2901 may be executed at one or more of the external electronic devices 2902, 2904, or 2908. For example, if the electronic device 2901 should perform a function or a service automatically, or in response to a request from a user or another device, the electronic device 2901, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 2901. The electronic device 2901 may provide the outcome, with or without further processing of the outcome, as at least part of a reply to the request. To that end, a cloud computing, distributed computing, or client-server computing technology may be used, for example.

One embodiment may be implemented as software (e.g., the program 2940) including one or more instructions that are stored in a storage medium (e.g., internal memory 2936 or external memory 2938) that is readable by a machine (e.g., the electronic device 2901). For example, a processor (e.g., the processor 2920) of the machine (e.g., the electronic device 2901) may invoke at least one of the one or more instructions stored in the storage medium, and execute it, with or without using one or more other components under the control of the processor. Thus, a machine may be operated to perform at least one function according to the at least one instruction invoked. The one or more instructions may include code generated by a complier or code executable by an interpreter. A machine-readable storage medium may be provided in the form of a non-transitory storage medium. The term "non-transitory" indicates that the storage medium is a tangible device, and does not include a signal (e.g., an electromagnetic wave), but this term does not differentiate between where data is semi-permanently stored in the storage medium and where the data is temporarily stored in the storage medium.

According to one embodiment, a method of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to one embodiment, each component (e.g., a module or a program) of the above-described components may include a single entity or multiple entities. According to one embodiment, one or more of the above-described components may be omitted, or one or more other components may be added. Alternatively or additionally, a plurality of components (e.g., modules or programs) may be integrated into a single component. In this case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 30:
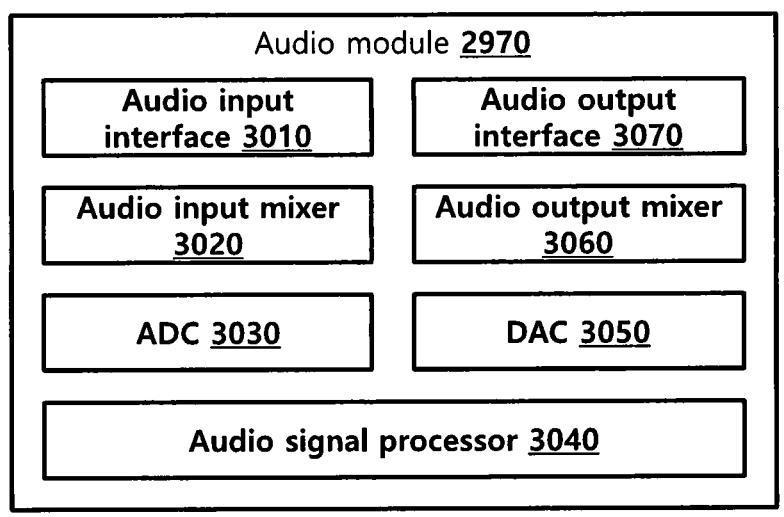
FIG. 30 is a block diagram of an audio module, according to one embodiment.

FIG. 30 is a block diagram of the audio module 2970, according to one embodiment. Referring to FIG. 30, the audio module 2970 may include, for example, an audio input interface 3010, an audio input mixer 3020, an analog-to-digital converter (ADC) 3030, an audio signal processor 3040, a digital-to-analog converter (DAC) 3050, an audio output mixer 3060, or an audio output interface 3070.

The audio input interface 3010 may receive an audio signal corresponding to a sound obtained from the outside of the electronic device 2901 via a microphone (e.g., a dynamic microphone, a condenser microphone, or a piezo microphone) that is configured as part of the input device 2950 or separately from the electronic device 2901. For example, if an audio signal is obtained from the external electronic device 2902 (e.g., a headset or a microphone), the audio input interface 3010 may be connected with the external electronic device 2902 directly via the connecting terminal 2978, or wirelessly (e.g., Bluetooth™ communication) via the wireless communication module 2992 to receive the audio signal. According to one embodiment, the audio input interface 3010 may receive a control signal (e.g., a volume adjustment signal received via an input button) related to the audio signal obtained from the external electronic device 2902. The audio input interface 3010 may include a plurality of audio input channels and may receive a different audio signal via a corresponding one of the plurality of audio input channels, respectively. According to one embodiment, additionally or alternatively, the audio input interface 3010 may receive an audio signal from another component (e.g., the processor 2920 or the memory 2930) of the electronic device 2901.

The audio input mixer 3020 may synthesize a plurality of inputted audio signals into at least one audio signal. For example, according to one embodiment, the audio input mixer 3020 may synthesize a plurality of analog audio signals inputted via the audio input interface 3010 into at least one analog audio signal.

The ADC 3030 may convert an analog audio signal into a digital audio signal. For example, according to one embodiment, the ADC 3030 may convert an analog audio signal received via the audio input interface 3010 or, additionally or alternatively, an analog audio signal synthesized via the audio input mixer 3020 into a digital audio signal.

The audio signal processor 3040 may perform various processing on a digital audio signal received via the ADC 3030 or a digital audio signal received from another component of the electronic device 2901. For example, according to one embodiment, the audio signal processor 3040 may perform changing a sampling rate, applying one or more filters, interpolation processing, amplifying or attenuating a whole or partial frequency bandwidth, noise processing (e.g., attenuating noise or echoes), changing channels (e.g., switching between mono and stereo), mixing, or extracting a specified signal for one or more digital audio signals. According to one embodiment, one or more functions of the audio signal processor 3040 may be implemented in the form of an equalizer.

The DAC 3050 may convert a digital audio signal into an analog audio signal. For example, according to one embodiment, the DAC 3050 may convert a digital audio signal processed by the audio signal processor 3040 or a digital audio signal obtained from another component (e.g., the processor 2920 or the memory 2930) of the electronic device 2901 into an analog audio signal.

The audio output mixer 3060 may synthesize a plurality of audio signals, which are to be outputted, into at least one audio signal. For example, according to one embodiment, the audio output mixer 3060 may synthesize an analog audio signal converted by the DAC 3050 and another analog audio signal (e.g., an analog audio signal received via the audio input interface 3010) into at least one analog audio signal.

The audio output interface 3070 may output an analog audio signal converted by the DAC 3050 or, additionally or alternatively, an analog audio signal synthesized by the audio output mixer 3060 to the outside of the electronic device 2901 via the sound output device 2955. The sound output device 2955 may include, for example, a speaker, such as a dynamic driver or a balanced armature driver, or a receiver. According to one embodiment, the sound output device 2955 may include a plurality of speakers. In such a case, the audio output interface 3070 may output audio signals having a plurality of different channels (e.g., stereo channels or 5.1 channels) via at least some of the plurality of speakers. According to one embodiment, the audio output interface 3070 may be connected with the external electronic device 2902 (e.g., an external speaker or a headset) directly via the connecting terminal 2978 or wirelessly via the wireless communication module 2992 to output an audio signal.

According to one embodiment, the audio module 2970 may generate, without separately including the audio input mixer 3020 or the audio output mixer 3060, at least one digital audio signal by synthesizing a plurality of digital audio signals using at least one function of the audio signal processor 3040.

According to one embodiment, the audio module 2970 may include an audio amplifier (e.g., a speaker amplifying circuit) that is capable of amplifying an analog audio signal inputted via the audio input interface 3010 or an audio signal that is to be outputted via the audio output interface 3070. According to one embodiment, the audio amplifier may be configured as a module separate from the audio module 2970.

Figure 31:
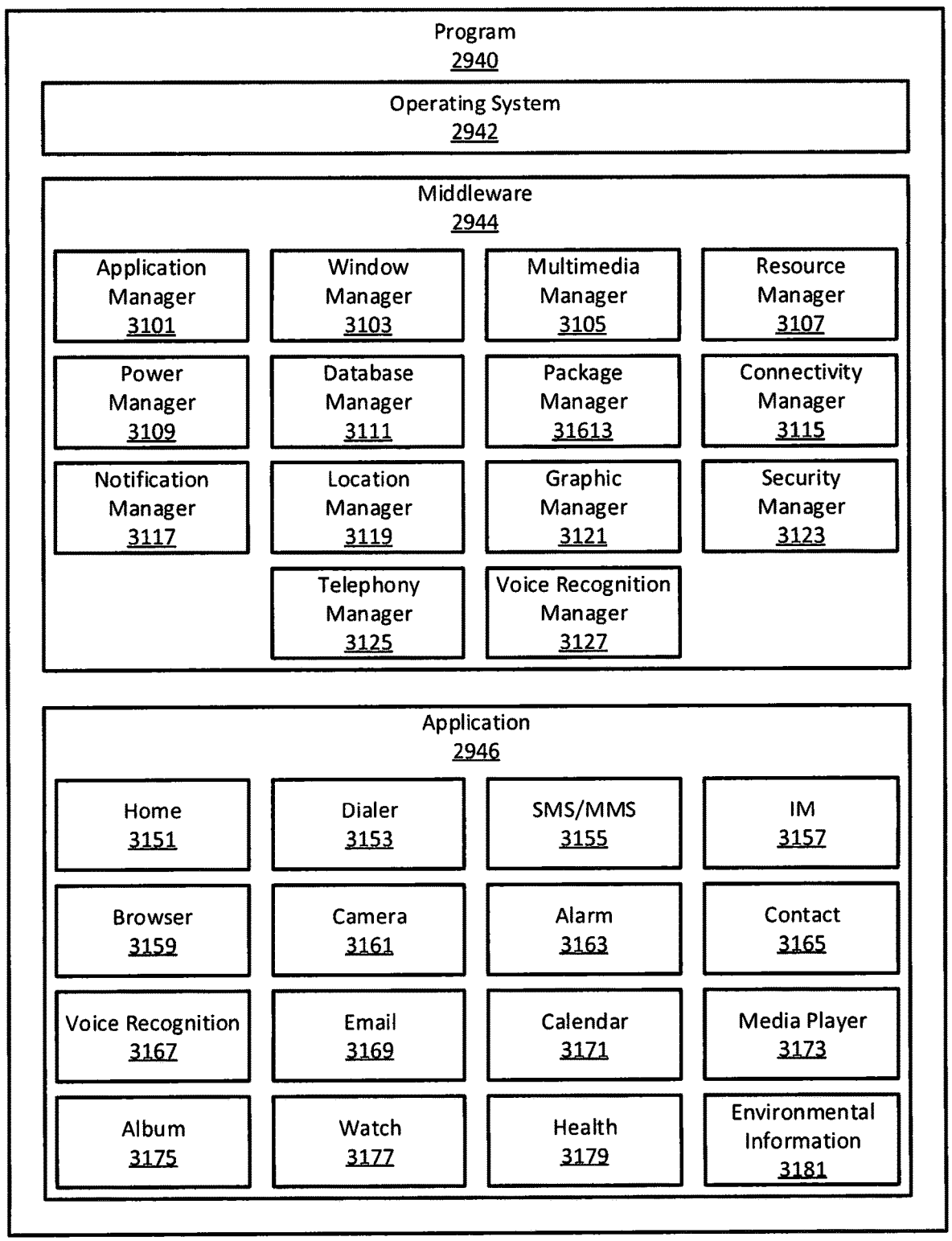
FIG. 31 is a block diagram of a program, according to one embodiment.

FIG. 31 is a block diagram of the program 2940 according to one embodiment. Referring to FIG. 31, the program 2940 may include an OS 2942 to control one or more resources of the electronic device 2901, middleware 2944, or an application 2946 executable in the OS 2942. The OS 2942 may include, for example, Android®, iOS®, Windows®, Symbian®, Tizen®, or Bada™. At least part of the program 2940, for example, may be pre-loaded on the electronic device 2901 during manufacture, or may be downloaded from or updated by an external electronic device (e.g., the electronic device 2902 or 2904, or the server 2908) during use by a user.

The OS 2942 may control management (e.g., allocating or deallocation) of one or more system resources (e.g., process, memory, or power source) of the electronic device 2901. The OS 2942, additionally or alternatively, may include one or more driver programs to drive other hardware devices of the electronic device 2901, for example, the input device 2950, the sound output device 2955, the display device 2960, the audio module 2970, the sensor module 2976, the interface 2977, the haptic module 2979, the camera module 2980, the power management module 2988, the battery 2989, the communication module 2990, the subscriber identification module 2996, or the antenna module 2997.

The middleware 2944 may provide various functions to the application 2946 such that a function or information provided from one or more resources of the electronic device 2901 may be used by the application 2946. The middleware 2944 may include, for example, an application manager 3101, a window manager 3103, a multimedia manager 3105, a resource manager 3107, a power manager 3109, a database manager 3111, a package manager 3113, a connectivity manager 3115, a notification manager 3117, a location manager 3119, a graphic manager 3121, a security manager 3123, a telephony manager 3125, or a voice recognition manager 3127.

The application manager 3101, for example, may manage the life cycle of the application 2946. The window manager 3103, for example, may manage one or more graphical user interface (GUI) resources that are used on a screen. The multimedia manager 3105, for example, may identify one or more formats to be used to play media files, and may encode or decode a corresponding one of the media files using a codec appropriate for a corresponding format selected from the one or more formats. The resource manager 3107, for example, may manage the source code of the application 2946 or a memory space of the memory 2930. The power manager 3109, for example, may manage the capacity, temperature, or power of the battery 2989, and determine or provide related information to be used for the operation of the electronic device 2901 based at least in part on corresponding information of the capacity, temperature, or power of the battery 2989. According to one embodiment, the power manager 3109 may interoperate with a basic input/output system (BIOS) of the electronic device 2901.

The database manager 3111, for example, may generate, search, or change a database to be used by the application 2946. The package manager 3113, for example, may manage installation or update of an application that is distributed in the form of a package file. The connectivity manager 3115, for example, may manage a wireless connection or a direct connection between the electronic device 2901 and the external electronic device. The notification manager 3117, for example, may provide a function to notify a user of an occurrence of a specified event (e.g., an incoming call, message, or alert). The location manager 3119, for example, may manage locational information on the electronic device 2901. The graphic manager 3121, for example, may manage one or more graphic effects to be offered to a user or a user interface related to the one or more graphic effects.

The security manager 3123, for example, may provide system security or user authentication. The telephony manager 3125, for example, may manage a voice call function or a video call function provided by the electronic device 2901. The voice recognition manager 3127, for example, may transmit a user's voice data to the server 2908, and receive, from the server 2908, a command corresponding to a function to be executed on the electronic device 2901 based at least in part on the voice data, or text data converted based at least in part on the voice data. According to one embodiment, the middleware 2944 may dynamically delete some existing components or add new components. According to one embodiment, at least part of the middleware 2944 may be included as part of the OS 2942 or may be implemented in other software separate from the OS 2942.

The application 2946 may include, for example, a home application 3151, a dialer application 3153, a short message service (SMS)/multimedia messaging service (MMS) application 3155, an instant message (IM) application 3157, a browser application 3159, a camera application 3161, an alarm application 3163, a contact application 3165, a voice recognition application 3167, an email application 3169, a calendar application 3171, a media player application 3173, an album application 3175, a watch application 3177, a health application 3179 (e.g., for measuring the degree of workout or biometric information, such as blood sugar), or an environmental information application 3181 (e.g., for measuring air pressure, humidity, or temperature information). According to one embodiment, the application 2946 may further include an information exchanging application that is capable of supporting information exchange between the electronic device 2901 and the external electronic device. The information exchange application, for example, may include a notification relay application adapted to transfer designated information (e.g., a call, a message, or an alert) to the external electronic device or a device management application adapted to manage the external electronic device. The notification relay application may transfer notification information corresponding to an occurrence of a specified event (e.g., receipt of an email) at another application (e.g., the email application 3169) of the electronic device 2901 to the external electronic device. Additionally or alternatively, the notification relay application may receive notification information from the external electronic device and provide the notification information to a user of the electronic device 2901.

The device management application may control the power (e.g., turn-on or turn-off) or the function (e.g., adjustment of brightness, resolution, or focus) of the external electronic device or some component thereof (e.g., a display device or a camera module of the external electronic device). The device management application, additionally or alternatively, may support installation, delete, or update of an application running on the external electronic device.

Figure 32:
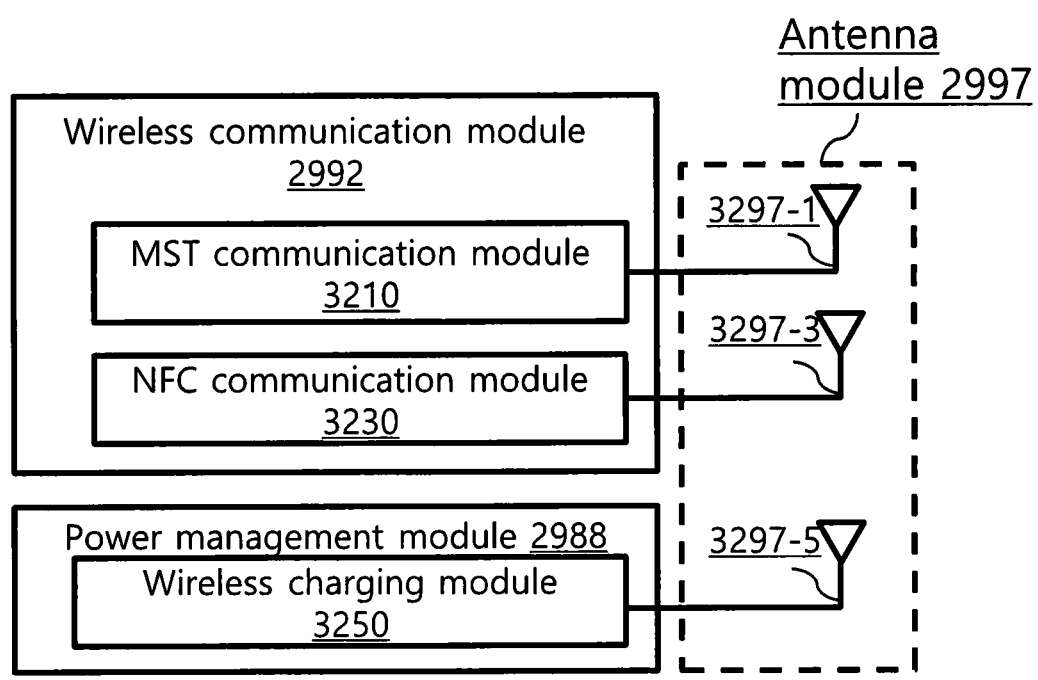
FIG. 32 is a block diagram of a wireless communication module, a power management module, and an antenna module of an electronic device, according to one embodiment.

FIG. 32 is a block diagram of the wireless communication module 2992, the power management module 2988, and the antenna module 2997 of the electronic device 2901, according to one embodiment.

Referring to FIG. 32, the wireless communication module 2992 may include a magnetic secure transmission (MST) communication module 3210 or a near-field communication (NFC) module 3230, and the power management module 2988 may include a wireless charging module 3250. In this case, the antenna module 2997 may include a plurality of antennas that include an MST antenna 3297-1 connected with the MST communication module 3210, an NFC antenna 3297-3 connected with the NFC communication module 3230, and a wireless charging antenna 3297-5 connected with the wireless charging module 3250. Descriptions of components described above with regard to FIG. 29 are either briefly described or omitted here.

The MST communication module 3210 may receive a signal containing control information or payment information such as card (e.g., credit card) information from the processor 2920, generate a magnetic signal corresponding to the received signal, and then transfer the generated magnetic signal to the external electronic device 2902 (e.g., a point-of-sale (POS) device) via the MST antenna 3297-1. To generate the magnetic signal, according to one embodiment, the MST communication module 3210 may include a switching module that includes one or more switches connected with the MST antenna 3297-1, and control the switching module to change the direction of voltage or current supplied to the MST antenna 3297-1 according to the received signal. The change of the direction of the voltage or current allows the direction of the magnetic signal (e.g., a magnetic field) emitted from the MST antenna 3297-1 to change accordingly. If detected at the external electronic device 2902, the magnetic signal with its direction changing may cause an effect (e.g., a waveform) similar to that of a magnetic field that is generated when a magnetic card corresponding to the card information associated with the received signal is swiped through a card reader of the electronic device 2902. According to one embodiment, for example, payment-related information and a control signal that are received by the electronic device 2902 in the form of the magnetic signal may be further transmitted to an external server 2908 (e.g., a payment server) via the network 2999.

The NFC communication module 3230 may obtain a signal containing control information or payment information such as card information from the processor 2920 and transmit the obtained signal to the external electronic device 2902 via the NFC antenna 3297-3. According to one embodiment, the NFC communication module 3230 may receive such a signal transmitted from the external electronic device 2902 via the NFC antenna 3297-3.

The wireless charging module 3250 may wirelessly transmit power to the external electronic device 2902 (e.g., a cellular phone or wearable device) via the wireless charging antenna 3297-5, or wirelessly receive power from the external electronic device 2902 (e.g., a wireless charging device). The wireless charging module 3250 may support one or more of various wireless charging schemes including, for example, a magnetic resonance scheme or a magnetic induction scheme.

According to one embodiment, some of the MST antenna 3297-1, the NFC antenna 3297-3, or the wireless charging antenna 3297-5 may share at least part of their radiators. For example, the radiator of the MST antenna 3297-1 may be used as the radiator of the NFC antenna 3297-3 or the wireless charging antenna 3297-5, or vice versa. In this case, the antenna module 2997 may include a switching circuit adapted to selectively connect (e.g., close) or disconnect (e.g., open) at least part of the antennas 3297-1, 3297-3, and 3297-5, for example, under control of the wireless communication module 2992 (e.g., the MST communication module 3210 or the NFC communication module 3230) or the power management module (e.g., the wireless charging module 3250). For example, when the electronic device 2901 uses a wireless charging function, the NFC communication module 3230 or the wireless charging module 3250 may control the switching circuit to temporarily disconnect at least one portion of the radiators shared by the NFC antenna 3297-3 and the wireless charging antenna 3297-5 from the NFC antenna 3297-3 and to connect the at least one portion of the radiators with the wireless charging antenna 3297-5.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. A phase-lock loop (PLL) electronic circuit, comprising:
a clock doubler;
a comparator that outputs a value representing a difference between a voltage at a voltage-to-current (Gm) circuit and a reference voltage that is adjusted to compensate for an offset of the comparator; and
a duty cycle calibration circuit that receives the value output from the comparator and adjusts a duty cycle of the PLL by extracting a duty cycle error from the value output from the comparator by correlating a frequency error with a cycle status and delaying a clock edge of the duty cycle according to the extracted duty cycle error.

2. The circuit of claim 1, wherein the duty cycle calibration circuit further includes a digital differentiator that extracts the duty cycle error from the value output from the comparator.

3. The circuit of claim 1, wherein the duty cycle calibration circuit extracts the cycle status from the value output from the comparator.

4. The circuit of claim 3, wherein the duty cycle calibration circuit delays the clock edge of the duty cycle based on the extracted cycle status.

5. The circuit of claim 4, wherein the duty cycle calibration circuit delays the clock edge of the duty cycle only when the extracted cycle status indicates an odd cycle.

6. The circuit of claim 1, further comprising a reference voltage generation circuit that adjusts the reference voltage to compensate for the comparator offset.

7. The circuit of claim 6, further comprising a digital-to-time converter (DTC) gain calibration circuit that adjusts a gain offset based on the value output from the comparator.

8. A method, comprising:
providing a clock doubler in a phase lock loop (PLL) circuit;
outputting, by a comparator, a value representing a difference between a voltage at a voltage-to-current (Gm) circuit and a reference voltage;
extracting, with a duty cycle calibration circuit, a duty cycle error in a duty cycle of the PLL from the output value from the comparator by correlating a frequency error with a cycle status; and
adjusting, with the duty cycle calibration circuit, the duty cycle by delaying a clock edge of the duty cycle according to the extracted duty cycle error.

9. The method of claim 8, further comprising adjusting, by a reference voltage generation circuit, the reference voltage according to the value output from the comparator.

10. The method of claim 8, wherein the extracting is further performed by a digital differentiator of the duty cycle calibration circuit.

11. The method of claim 8, wherein the extracting further comprises extracting the cycle status from the value output from the comparator.

12. The method of claim 11, wherein the duty cycle calibration circuit delays the clock edge of the duty cycle based on the extracted cycle status.

13. The method of claim 12, wherein the duty cycle calibration circuit delays the clock edge of the duty cycle only when the extracted cycle status indicates an odd cycle.

14. The method of claim 8, further comprising calibrating, with a digital-to-time converter (DTC) gain calibration circuit, a DTC gain of the PLL.

15. The method of claim 14, wherein the DTC calibration circuit calibrates a DTC gain of the PLL and the duty cycle calibration circuit adjusts the duty cycle of the PLL based on the value output from the comparator.

16. An electronic device having a phase-lock loop (PLL) electronic circuit, comprising:
a clock doubler;
a comparator that outputs a value representing a difference between a voltage at a voltage-to-current (Gm) circuit and a reference voltage;
a reference voltage generator that adjusts the reference voltage based on the value output from the comparator; and
a duty cycle calibration circuit that extracts a duty cycle error from the value output from the comparator by correlating a frequency error with a cycle status and delays a clock edge of the duty cycle according to the extracted duty cycle error.

17. The electronic device of claim 16, further comprising a digital-to-time converter (DTC) gain calibration circuit that adjusts a DTC gain of the PLL based on the value output from the comparator.

18. The electronic device of claim 17, wherein the duty cycle calibration circuit and the DTC gain calibration circuit both utilize the value output from the comparator simultaneously.

19. The electronic device of claim 16, wherein the duty cycle calibration circuit extracts the cycle status from the value output from the comparator that indicates an even cycle status or an odd cycle status.

20. The electronic device of claim 19, wherein the duty cycle calibration circuit delays the clock edge of the duty cycle only when the extracted cycle status indicates an odd cycle status.

* * * * *